United States Patent
Lin et al.

(10) Patent No.: US 11,417,370 B2
(45) Date of Patent: Aug. 16, 2022

(54) MEMORY DEVICE

(71) Applicant: Taiwan Semiconductor Manufacturing Company, Ltd., Hsinchu (TW)

(72) Inventors: Chien-Chen Lin, Kaohsiung (TW); Wei Min Chan, Taipei County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 97 days.

(21) Appl. No.: 16/991,178

(22) Filed: Aug. 12, 2020

(65) Prior Publication Data
US 2022/0051702 A1 Feb. 17, 2022

(51) Int. Cl.
| G11C 16/10 | (2006.01) |
| G11C 5/14  | (2006.01) |
| G11C 8/08  | (2006.01) |
| G11C 7/12  | (2006.01) |
| G11C 7/22  | (2006.01) |

(52) U.S. Cl.
CPC ............... *G11C 5/148* (2013.01); *G11C 7/12* (2013.01); *G11C 7/22* (2013.01); *G11C 8/08* (2013.01)

(58) Field of Classification Search
CPC .. G11C 5/148; G11C 7/12; G11C 7/22; G11C 8/08
See application file for complete search history.

(56) References Cited

U.S. PATENT DOCUMENTS

| 8,305,839 | B2 | 11/2012 | Tsern et al. |
| 9,251,875 | B1* | 2/2016 | Atallah ................. G11C 11/419 |
| 10,109,342 | B2* | 10/2018 | Roy .................. H01L 27/10897 |
| 2003/0016564 | A1* | 1/2003 | Schramm ............ G11C 11/4094 |
| | | | 365/189.07 |
| 2009/0273989 | A1* | 11/2009 | Wong ..................... G11C 7/222 |
| | | | 365/189.12 |
| 2014/0139276 | A1* | 5/2014 | Dally ........................ G06F 1/10 |
| | | | 327/153 |
| 2017/0372794 | A1* | 12/2017 | Walker .................. G11C 11/419 |

FOREIGN PATENT DOCUMENTS

TW 538342 B 6/2003

* cited by examiner

*Primary Examiner* — Hien N Nguyen
(74) *Attorney, Agent, or Firm* — Merchant & Gould P.C.

(57) ABSTRACT

A method of operating a memory device is provide. A clock signal is received. Each clock cycle of the clock signal initiates a write operation or a read operation in a memory device. A power nap period is then determined. The power nap period is compare with a clock cycle period to determine that the power nap period is less that the clock cycle period of the clock signal. A header control signal is generated in response to determining that the power nap period is less than the clock cycle period. The header control signal turns off a header of a component of the memory device.

20 Claims, 21 Drawing Sheets

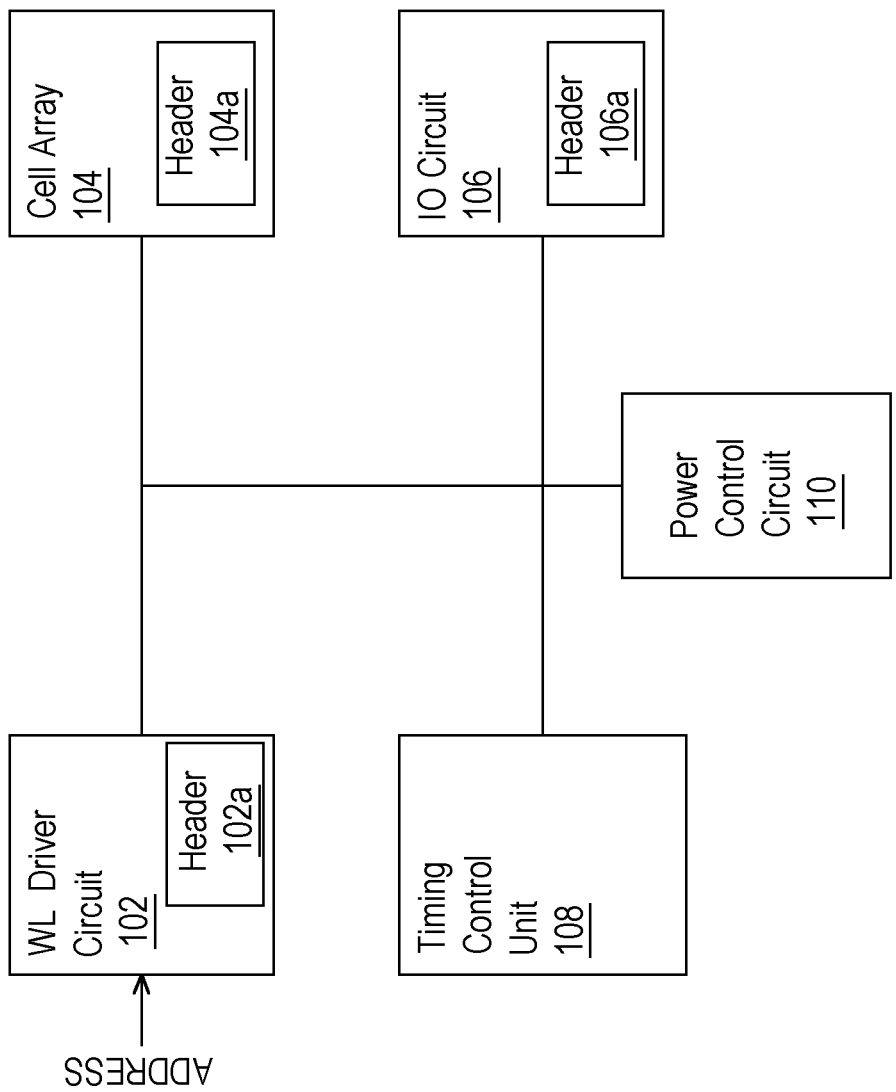

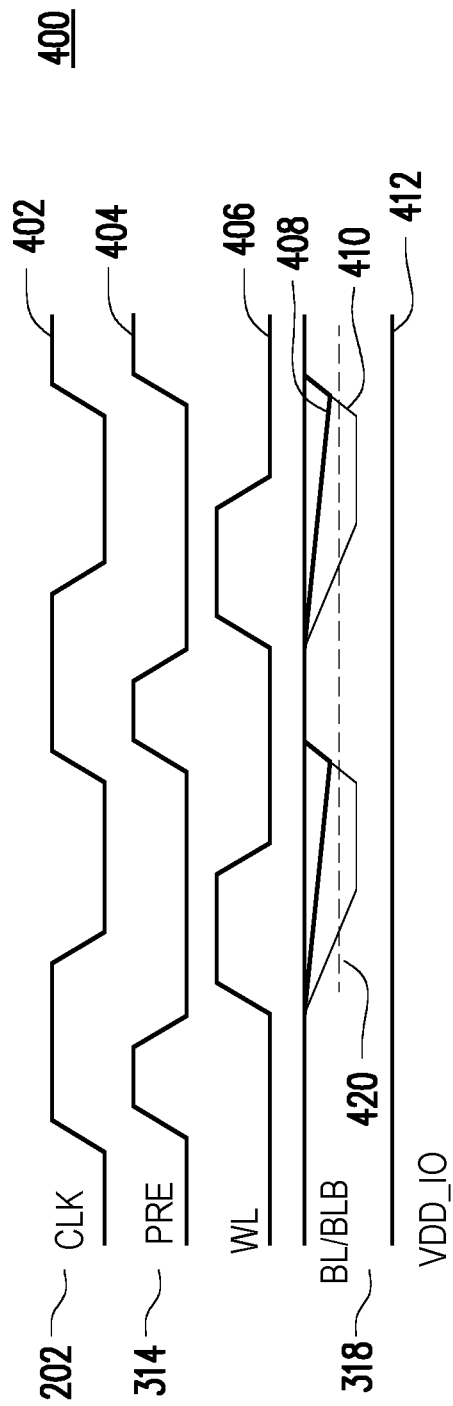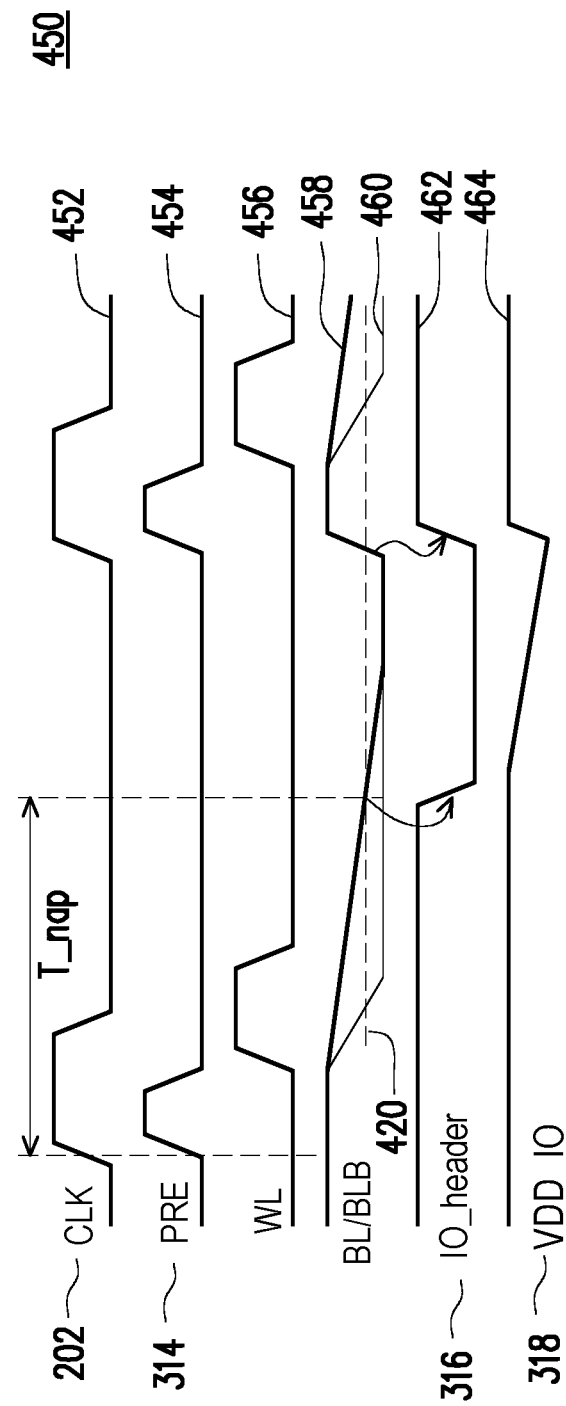

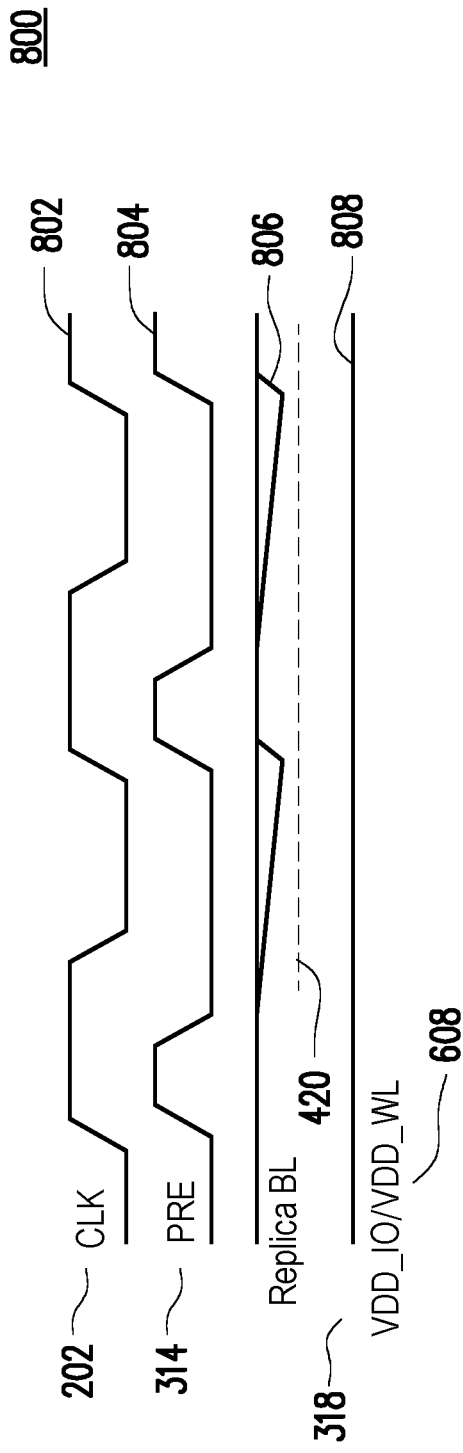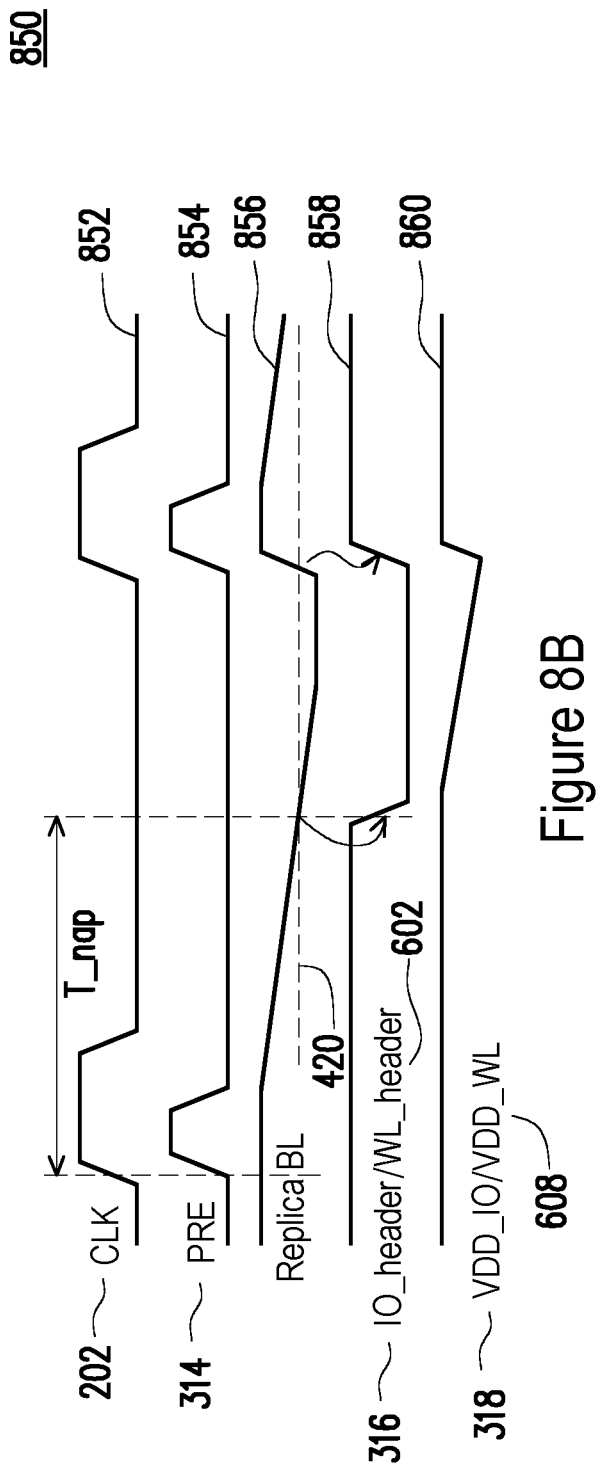

Figure 10

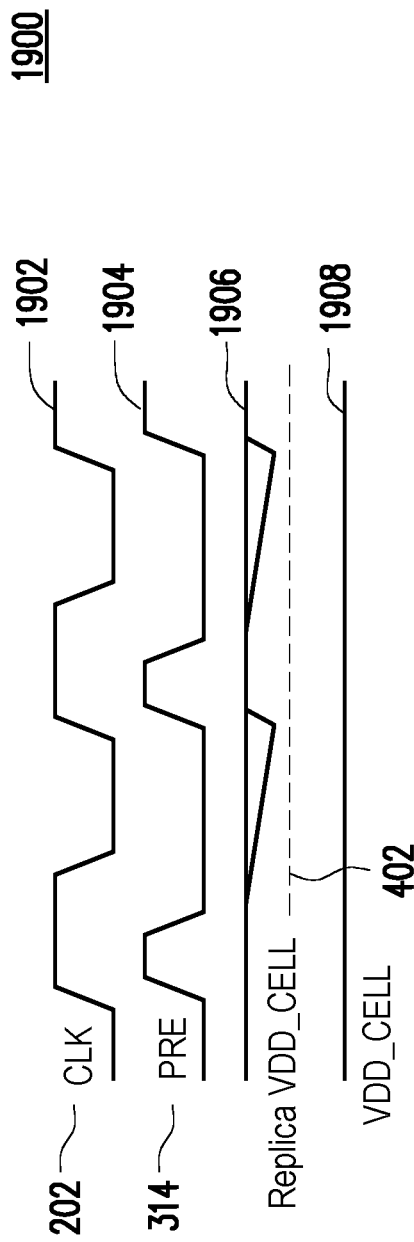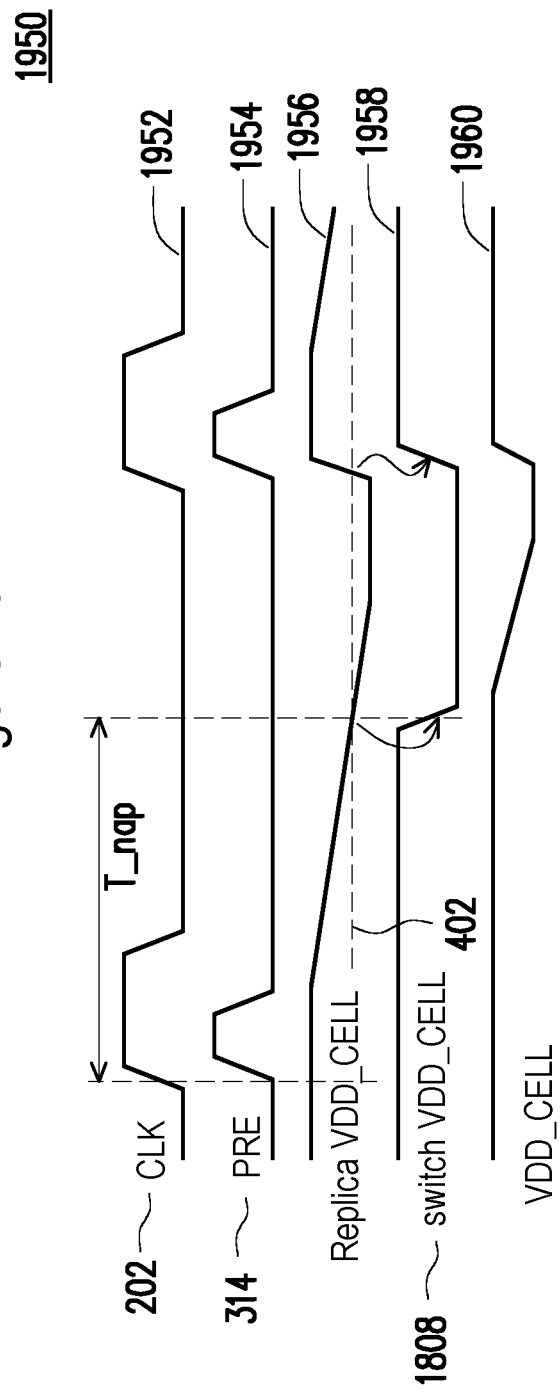

Memory DEVICE

BACKGROUND

Memory devices, such as random access memory (RAM) is typically used for temporary storage of data. There are several types of RAMs including dynamic random access memory (DRAM) and a static random access memory (SRAM). Scaling of integrated circuit (IC) techniques to the nanometer region has increased power dissipation of these memory devices. The increased power dissipation causes several problems including reducing battery life, expensive packaging and cooling solutions and can also result in chip failures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a block diagram illustrating an example memory device in accordance with some embodiments.

FIG. 4A is a graph illustrating a clock signal at a first frequency and other signals of a memory device of FIG. 3 corresponding to the clock signal at the first frequency, in accordance with some embodiments.

FIG. 4B is a graph illustrating a clock signal at a second frequency and other signals of a memory device of FIG. 3 corresponding to the clock signal at the second frequency, in accordance with some embodiments.

FIG. 8A is a graph illustrating a clock signal at a first frequency and other signals of a memory devices of FIGS. 5 and 6 corresponding to the clock signal at the first frequency, in accordance with some embodiments.

FIG. 8B is a graph illustrating a clock signal at a second frequency and other signals of a memory devices of FIGS. 5 and 6 corresponding to the clock signal at the second frequency, in accordance with some embodiments.

FIG. 10 is a diagram illustrating a memory device with yet another example header power control mechanism in a nap mode, in accordance with some embodiments.

FIG. 19A is a graph illustrating a clock signal at a first frequency and other signals of a memory devices of FIG. 18 corresponding to the clock signal at the first frequency, in accordance with some embodiments.

FIG. 19B is a graph illustrating a clock signal at a second frequency and other signals of a memory devices of FIG. 18 corresponding to the clock signal at the second frequency, in accordance with some embodiments.

DETAILED DESCRIPTION

Figure 2A:
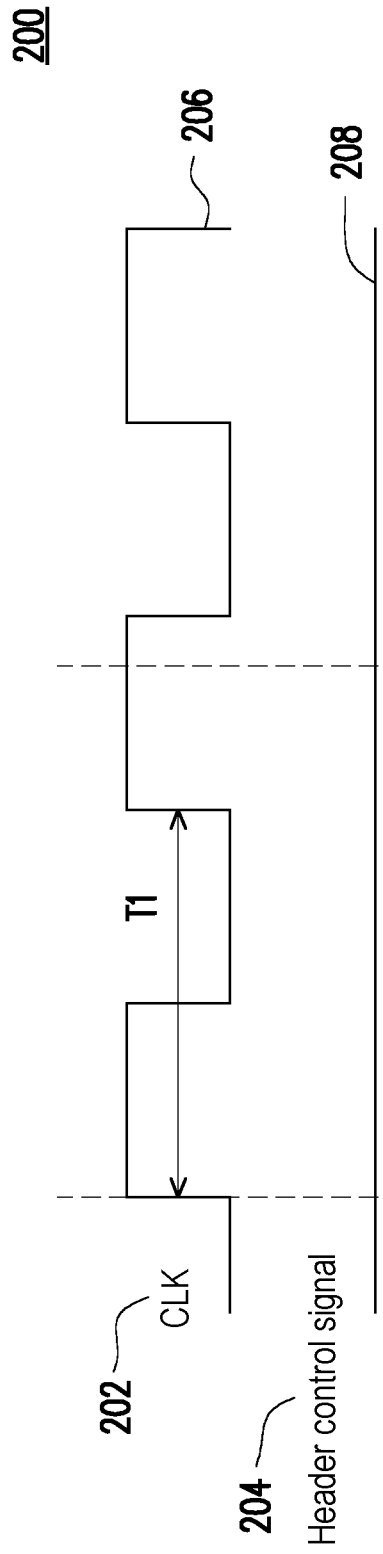
FIG. 2A is a graph illustrating a clock signal at a first frequency and a corresponding header control signal, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides techniques for selectively switching off one or more headers of one or more components of a memory device operating in a nap mode after a read or a write operation. In a conventional nap mode, parts of headers of a memory device are switched off after a read and write operation is finished for each clock cycle. Thus some leakage current is saved before a next clock cycle is received. However, switching off headers after every clock cycle causes a higher active power consumption compared to a non-nap mode. For example, switching off of the headers requires generating additional control signals for every clock cycle. Generating these additional control signals consumes active power. And if the headers are not switched off for a long enough time period, generating the control signals results in more active power consumption than the active power saved by switching off the headers. Therefore, a memory device may consume more power in the conventional nap mode than the non-nap mode, especially at high frequency operation.

The disclosure provides techniques to reduce the power consumption of a memory device operating in a nap mode. FIG. 1 is a block diagram of a memory device 100 in which the disclosed techniques can be implemented in accordance with example embodiments. Memory device 100 can be a random access memory (RAM) including dynamic random access memory (DRAM) and a static random access memory (SRAM). However, it will be apparent to a person with an ordinary skill in the art after reading this disclosure that other types of memory devices are within the scope of the disclosure. As shown in FIG. 1, memory device 100 includes a word line driver circuit 102, a cell array 104, an input/output (I/O) circuit 106, a timing control unit 108, and a power control circuit 110. However, it will be apparent to a person with ordinary skill in the art after reading this disclosure that memory device 100 can include more components than those shown in FIG. 1.

Cell array 104 includes a plurality of cells (also referred to as bit cells or memory cells). Each cell of cell array 104 is can store one bit of information (that is, a bit value of 0 or a bit value of 1). In some examples, the plurality of cells of cell array 104 are arranged in a matrix of a plurality of rows and a plurality of columns. Each row of the plurality of rows includes a first plurality of cells of the plurality of cells. Each column of the plurality of columns include a second plurality of cells of the plurality of cells. Cell array 104 includes a header 104a (also referred to as a cell array header 104a). Cell array header 104a provides a virtual power to power up components of cell array 104.

An example cell of the plurality of cells includes a pair of cross-coupled invertors (also referred to as Q and Q-bar, where Q-bar is complementary to Q) to store the one bit of information. The cross coupled inverters are connected to pair of access transistors which grant access to the information stored in the cross-coupled invertors. The plurality of cells of cell array 104 can be formed using four transistors, six transistors, eight transistors, ten transistors, etc. In addition, the plurality of cells of cell array 104 are a single port cell or a multi-port (such as, a dual port and a three port) cell.

Word line driver circuit 102 is connected to cell array 104 and is operative to select a word line of cell array 104 and charge the selected word line to a logic high for a read operation or a write operation. In some examples, word line driver circuit 102 is a decoder circuit which includes a plurality of logic operators to decode potentials on address lines to identify a word line to activate. The address lines are charged to a logic high (that is, approximately equal to a first predefined potential) or a logic low (that is, approximately equal to a second predefined potential). The first predefined potential is approximately equal to a supply voltage (that is, VDD). The second predetermined potential is approximately equal to the ground potential or zero volts. However, other suitable logic low voltages may be employed. A logic high is represented by bit 1 and a logic low is represented by bit 0. Word line driver circuit 102 also includes word line driver header 102a (also referred to as a header 102a of word line driver 102). Word line driver header 102a provides a virtual power to power up components of word line driver circuit 102 for a read and a write operation.

I/O circuit 106 is connected to cell array 104 and is operative to read data from and write data into cell array 104. For example, I/O circuit 106 can include a multiplexer circuit to select a column of cell array 104, a pre-charge circuit to pre-charge a bit line pair associated with a selected column, a read circuit operative to read data from one or more cells located in the selected column, a write circuit to write data into one or more cells located in the selected column, etc. I/O circuit 106 includes an I/O header 106a (also referred to as a header 106a of I/O circuit 106) which is operative to power up components of I/O circuit 106 for a read and a write operation.

Timing control unit 108 is operative to generate a clock signal for components of memory device 100. For example, timing control unit 108 is operative to generate a signal for word line driver 102 and input/output (I/O) circuit 106. The signal is generated based on an input from a clock signal (labeled as CLK). Each cycle of the clock signal may indicate beginning of a read operation or write operation.

Power control circuit 110 is operative to selectively turn off a header or a portion of a header of at least one of word line driver 102, cell array 104, and I/O circuit 106. For example, and discussed in greater detail in the following sections of the disclosure, power control circuit 110 is operative to determine a power nap period, determine that the power nap period is shorter or less than a clock cycle period of a clock signal, and generate a header control signal in response to determining that the power nap period is shorter than the clock cycle period. The header control signal turns off a header or a portion of a header of one or more of cell array 104, word line driver 102, and I/O circuit 106.

FIG. 2A is a graph 200 illustrating an example clock signal 202 at a first frequency and a corresponding header control signal 204 in accordance with some embodiments. For example, a first plot 206 of graph 200 is a representative of clock signal 202 and a second plot 208 of graph 200 is a representative of header control signal 204. As shown in first plot 206 of graph 200, clock signal 202 has a cycle period of T1. The cycle period T1 is less than a power nap period T_nap, and hence, and as shown in second plot 208 of graph 200, header control signal 208 remains at a second logic value (that is, a logic low). When header control signal 208 is at a logic low none of word line driver header 102a, cell array header 104a, or I/O header 106a are switched off. Therefore, and in example embodiments, when the clock cycle period T1 of clock signal 202 is less than the power nap period T_nap, none of the headers (that is, word line driver header 102a, cell array header 104a, or I/O header 106a) of memory device 100 are switched off between the clock cycles. Stated another way, when the clock cycle period T1 of clock signal 202 is less than the power nap period T_nap, word line driver header 102a, cell array header 104a, or I/O header 106a of memory device 100 remain switched on between write cycles.

Figure 2B:
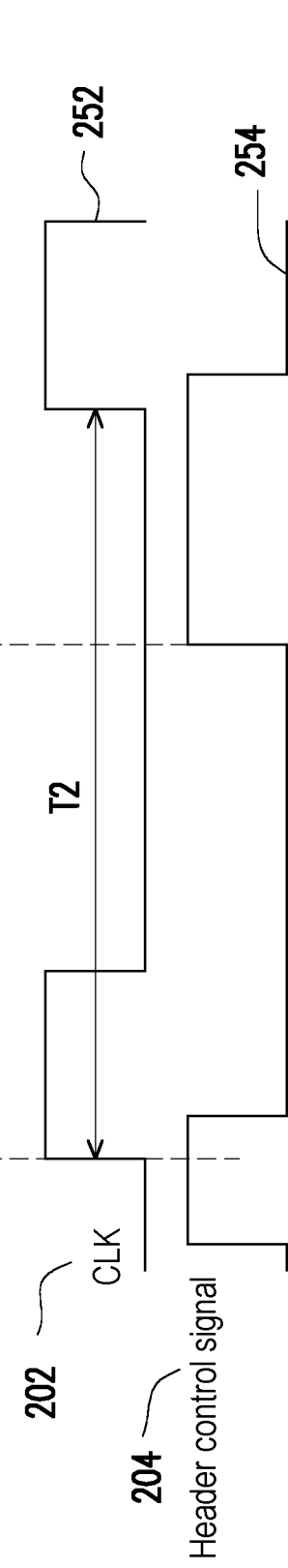
FIG. 2B is a graph illustrating a clock signal at a second frequency and a corresponding header control signal, in accordance with some embodiments.

FIG. 2B is a graph 250 illustrating an example clock signal 202 at a second frequency and a corresponding header control signal 204, in accordance with some embodiments. For example, a first plot 252 of graph 250 is a representative of clock signal 202 at a second frequency different from the first frequency of FIG. 2A. Second plot 254 of graph 250 is representative of header control signal 204. As shown in second plot 254 of graph 250, clock signal 202 has a cycle period of T2. The cycle period T2 is greater than the power nap period T_nap. Therefore, and as shown in second plot 254 of graph 250, header control signal 204 changes from a second logic value (that is, a logic low) to a first logic value (that is, a logic high) at an end of the power nap period T_nap for each clock cycle.

When header control signal 204 is at a logic high, a header or a portion of a header (that is, one or a portion of one of word line driver header 102a, cell array header 104a, or I/O header 106a) of memory device 100 is switched off. Thus, in accordance with example embodiments, a header or a portion of a header of memory device 100 is switched off for each clock cycle when the cycle period T2 of clock signal 202 is more than the power nap period T_nap. As shown in second plot 254 of graph 250, header control signal 204 changes back to a logic low at the beginning of a next clock cycle of clock signal 202 which switches back on headers of memory device 100. Hence, and in example embodiments, a header or a portion of a header of memory device is switched off from a beginning of the power nap period T_nap to a beginning of a next clock cycle when a clock cycle period of clock signal 202 is greater than the power nap period T_nap.

Figure 3:
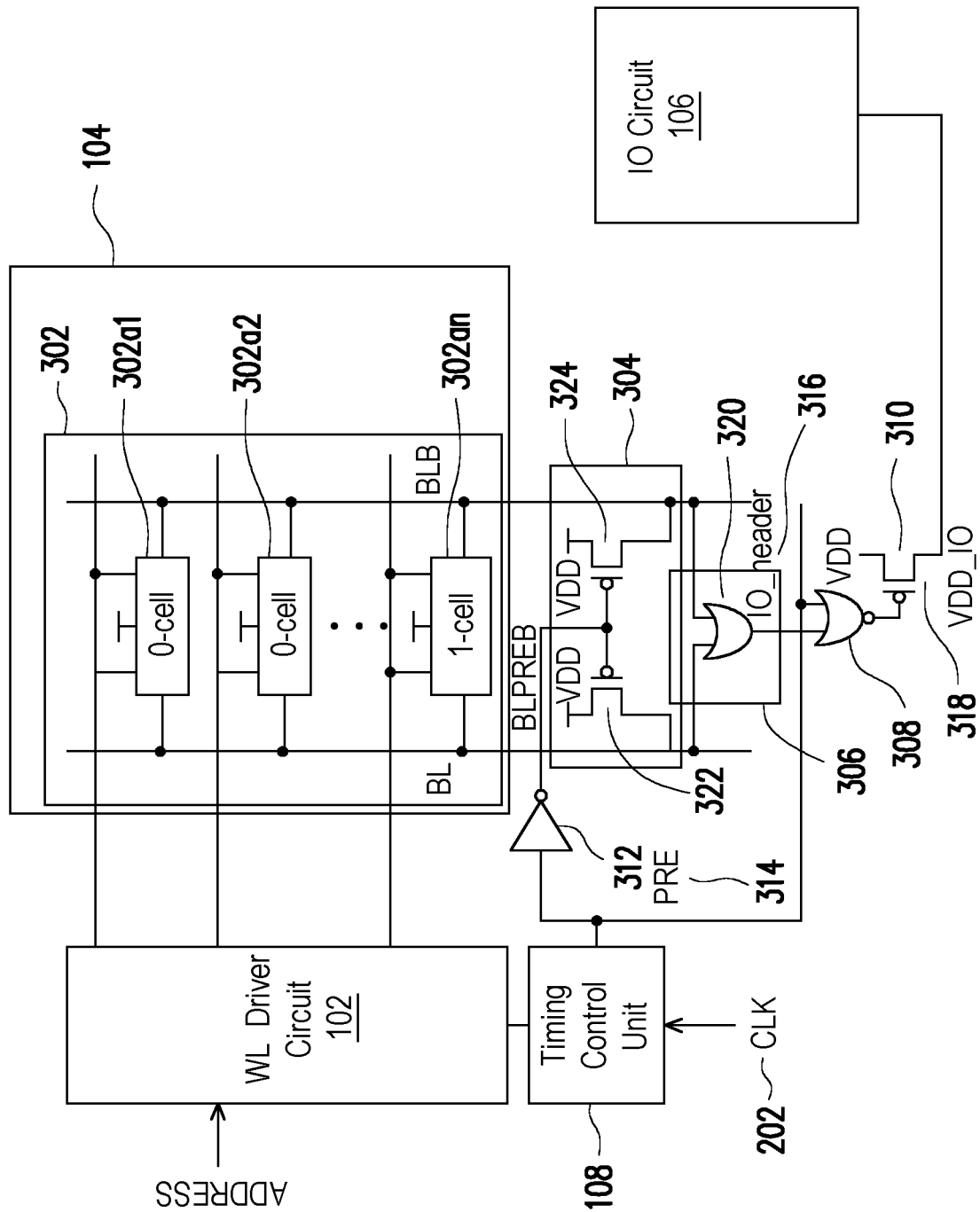
FIG. 3 is a diagram illustrating a memory device with an example header power control mechanism in a nap mode, in accordance with some embodiments.

FIG. 3 is a diagram illustrating a memory device 100 with a header control mechanism in a nap mode, in accordance with some embodiments. As shown in FIG. 3, memory device 100 includes word line driver circuit 102, cell array 104, I/O circuit 106, and timing control unit 108. In addition, and as shown in FIG. 3, memory device 100 includes a pre-charge circuit 304, a voltage detector 306, a NOR logic circuit 308, a power control transistor 310, and a NOT logic circuit 312. Power control transistor 310 forms I/O header 306a or a portion of I/O header 306a. Although it is shown separate from I/O circuit 106, it will be apparent to a person with skill in the art after reading this disclosure that power control transistor 310 can be part of I/O circuit 106. Similarly, although it is shown separate from I/O circuit 106, it will be apparent to a person with skill in the art after reading this disclosure that pre-charge circuit 304 can be part of I/O circuit 106. In addition, one or more of voltage detector 306 and NOR logic circuit 308 are part of power control circuit 110. Moreover, it will be apparent to a person with ordinary skill in the art after reading this disclosure that memory device 100 can include more components of fewer components than those shown in FIG. 3.

Pre-charge circuit 304 is operative to charge a bit line pair associated with a selected column for a read or write operation, for example a column 302, of cell array 104. As shown in FIG. 3, column 302 includes a first plurality of cells labeled as 302a1, 302a2, . . . , 302an. Each of first plurality of cells 302a1, 302a2, . . . , 302an are connected to a bit line BL and a complementary bit line BLB. Each of the bit line BL and the complementary bit line BLB are charged to a predetermined voltage for a read or write operation by pre-charge circuit 304.

As shown in FIG. 3, pre-charge circuit 304 includes a pre-charge first transistor 322 and a pre-charge second transistor 324. A source of each of pre-charge first transistor 322 and pre-charge second transistor 324 is connected to a supply voltage (that is, VDD). A drain of pre-charge first transistor 322 is connected to the bit line BL and a drain of pre-charge second transistor 324 is connected to complementary bit line BLB. A gate of pre-charge first transistor 322 is connected to a gate of pre-charge second transistor 324 which in turn is connected to an output terminal of a NOT logic circuit 312.

Each of pre-charge first transistor 322 and pre-charge second transistor 324 are p-channel metal oxide semiconductor (pMOS) transistors. However, other types of transistors are within the scope of the disclosure. For example, each of pre-charge first transistor 322 and pre-charge second transistor 324 can be a metal oxide semiconductor field effect transistor (MOSFET), an n-channel metal oxide semiconductor (nMOS) transistor, and a complementary metal oxide semiconductor (CMOS) transistor. In addition, each of pre-charge first transistor 322 and pre-charge second transistor 324 are symmetrical. That is, a source of each of pre-charge first transistor 322 and pre-charge second transistor 324 can be a drain, and a drain of each of pre-charge first transistor 322 and pre-charge second transistor 324 can be a source.

Continuing with FIG. 3, the bit line BL and the complementary bit line BLB are connected to voltage detector 306. Voltage detector 306 is operative to continuously compare a remaining potential or a remaining voltage on each of the bit line BL and the complementary bit line BLB with a predetermined voltage level. Based on the comparison, voltage detector 306 provides an output of a first logic value (for example, a logic value high) when the remaining voltage on both the bit line BL and the complementary bit line BLB is less than the predetermined voltage level. In addition, based on the comparison, voltage detector 306 provides an output of a second logic value (for example, a logic value low) when the remaining voltage on either the bit line BL or the complementary bit line BLB is greater than the predetermined voltage level. An output of voltage detector circuit 306 is also referred to as IO_header signal 316 (also referred to as header control signal 204). In example embodiments, voltage detector 306 can include an OR logic circuit 320. In some examples, OR logic circuit 329 is an OR logic gate. However, other types of logic gates are within the scope of disclosure.

An output terminal of voltage detector 306 is connected to a first input terminal of NOR logic circuit 308. A second input terminal of NOR logic circuit 308 is connected to a first output terminal of timing control unit 108. The first output terminal of timing control unit 108 is also connected to an input terminal of NOT logic circuit 312. A second output terminal of timing control unit is connected to word line driver circuit 102.

An output terminal of NOR logic circuit 308 is connected to a gate of power control transistor 310 (that is, I/O header 106a or a portion of I/O header 106a). A source of power control transistor 310 is connected to a supply voltage (that is, VDD) and a drain of power control transistor 310 is connected to I/O circuit 106. Power control transistor 310 is a pMOS transistors. However, it will be apparent to a person with ordinary skill in the art after reading this disclosure power control transistor 310 can be a MOSFET, an nMOS transistor, or a CMOS transistor. In addition, power control transistor 310 is symmetrical. That is, a source of power control transistor 310 can be a drain, and a drain can be a source.

During a read or a write operation, timing control unit 108 is operative to generate PRE signal 314 based on clock signal 202. For example, PRE signal 314 rises to a logic high when clock signal 202 rises to a logic high. When PRE signal 314 rises to a logic high, the output terminal of NOT logic circuit 312 and, hence, a BLPREB signal changes to a logic low. When the output terminal of NOT logic circuit 312 is at a logic low, gates of both pre-charge first transistor 322 and pre-charge second transistor 324 are at a logic low which switches on both pre-charge first transistor 322 and pre-charge second transistor 324. This in turn connects both of the bit line BL and the complementary bit line BLB to a supply voltage (that is, VDD) thereby pre-charging both the bit line BL and complementary bit line BLB to a predetermined voltage level (or to VDD).

When pre-charged, both of the bit line BL and complementary bit line BLB are above the predetermined voltage level, and therefore, an output terminal of voltage detector 306 (that is, IO_header signal 316 or header control signal 204) is at a logic high. By extension, the first input terminal of NOR logic circuit 308 is at a logic high, and therefore, an output of NOR logic circuit 308 (that is, the output terminal of NOR logic circuit 308) is at a logic low. In addition, when the output terminal of NOR logic circuit 308 is at a logic low, the gate of power control transistor 310 is at a logic low which switches on power control transistor 310 (that is, I/O header 106a or a portion of I/O header 106a). Switching on of power control transistor 310 causes the drain of power control transistor 310 to be connected to a supply voltage (that is, VDD) and to be at a logic high. This causes, VDD_IO signal 318 (that is virtual power supply signal) to be at a logic high. Therefore, IO_header signal 316 (that is, header control signal 204) and VDD_IO signal 318 (that is, the virtual power supply signal for I/O circuit 106) are at a logic high when a remaining voltage on either the bit line BL or the complementary bit line BLB is above the predetermined voltage level.

After a predetermined time from when PRE signal 314 rises to a logic high, PRE signal 314 drops to a logic low (indicating end of a clock cycle or a write cycle). When PRE signal 314 drops to a logic low, the output terminal of NOT logic circuit 312 (and the BLPREB signal) rises to a logic high. When the output terminal of NOT logic circuit 312 is at a logic high, gates of both pre-charge first transistor 322 and pre-charge second transistor 324 are at a logic high which switches off both pre-charge first transistor 322 and pre-charge second transistor 324. This in turn disconnects each of the bit line BL and complementary bit line BLB from a supply voltage (that is, VDD). The disconnection from the supply voltage initiates a discharging of each of the bit line BL and complementary bit line BLB through first plurality of cells 302a1, 302a2, . . . , 302an.

When a remaining voltage on both the bit line BL and complementary bit line BLB drops below the predetermined voltage level, the output terminal of voltage detector 306 (that is, IO_header signal 316 or header control signal 204) drops to a logic low. By extension, the first input terminal of NOR logic circuit 308 drops to a logic low which drives the output terminal of NOR logic circuit 308 to a logic high. In addition, when the output terminal of NOR logic circuit 308 is at a logic high, the gate of power control transistor 310 is also at a logic high which switches off power control transistor 310 (that is, I/O header 106a or a portion of I/O header 106a). This causes the drain of power control transistor 310 (that is, VDD_IO signal 318) to drop to a logic low. Therefore, IO_header signal 316 (that is, header control signal 204) and VDD_IO signal 318 (that is, the virtual power supply signal) are at a logic low when a remaining voltage on both of the bit line BL and the complementary bit line BLB is below the predetermined voltage level. A time period, between a time of pre-charging of the bit line BL and the complementary bit line BLB and a time when the remaining voltage on both of the bit line BL and the complementary bit line BLB drops below the predetermined voltage level is referred to as the power nap period T_nap.

FIG. 4A is a graph 400 illustrating clock signal 202 at a first frequency and other signals of memory device 100 of FIG. 3 corresponding to clock signal 202 at the first frequency, in accordance with some embodiments. For example, a first plot 402 of graph 400 is a representative of clock signal 202, a second plot 404 of graph 400 is a representative of PRE signal 314, a third plot 406 of graph 400 is a representative of a remaining voltage on word line WL, a fourth plot 408 of graph 400 is a representative of a remaining voltage on the bit line BL, a fifth plot 410 of graph 400 is a representative of a remaining voltage on the complementary bit line BLB, and a sixth plot 412 of graph 400 is representative of VDD_IO signal 318 (that is, the virtual power supply signal).

As shown first plot 402 and second plot 404 of graph 400, PRE signal 314 rises to a logic high when clock signal 202 rises to a logic high. In addition, and as shown in third plot 406, the voltage on word line WL rises to a logic high after a predetermined time from when clock signal 202 rises to a logic high. Moreover, and as shown in fourth plot 408 and fifth plot 410, the remaining voltage on each of the bit line BL and the complementary bit line BLB starts dropping when PRE signal 314 drops to a logic low from a logic high. PRE signal 314 changes to a logic low from a logic high after pre-charging both of the bit line BL and the complementary bit line BLB.

However, and as shown fourth plot 408, the remaining voltage on the bit line BL does not drop below a predetermined voltage level 420 before a beginning of a next clock cycle. And when clock signal 202 rises to a logic high for a next clock cycle, the remaining voltages on both the bit line BL and the complementary bit line BLB starts to rise. Hence, and as shown in sixth plot 412, VDD_IO signal 318, which is a logical OR of the remaining voltages on the bit line BL and the complementary bit line BLB, remains at a logic high. As a result, and in accordance with example embodiments, I/O circuit header 106a remains switched on when the cycle period of clock signal 202 is less than the power nap period T_nap. By extension the virtual power supply signal (that is, VDD_IO signal 318) remains at a logic high when the cycle period of clock signal 202 is less than the power nap period T_nap.

FIG. 4B is a graph 450 illustrating clock signal 202 at a second frequency and other signals of memory device 100 corresponding to clock signal 202 at the second frequency in accordance with some embodiments. For example, a first plot 452 of graph 450 is a representative of clock signal 202 at a second frequency, a second plot 454 of graph 450 is a representative of PRE signal 314, a third plot 456 of graph 450 is a representative of a voltage on the word line WL, a fourth plot 458 of graph 450 is a representative of a voltage on the bit line BL, a fifth plot 460 of graph 450 is a representative of a voltage on the complementary bit line BLB, a sixth plot 462 of graph 450 is a representative of IO_header signal 316, and a seventh plot 464 of graph 450 is representative of VDD_IO signal 318.

As shown first plot 452 of FIG. 4B, the second frequency of clock signal 202 is lower than the first frequency associated depicted in first plot 408 of FIG. 4A. Therefore, a clock cycle period T2 for clock signal 202 corresponding to the second frequency is greater than the clock cycle period T1 of clock cycle 202 at the first. The longer clock cycle period provides, and as shown in a third plot 456 and fourth plot 458 of graph 450, sufficient time (that is, the power nap period T_nap) for the remaining voltages on both of the bit line BL and the complementary bit line BLB to drop below predetermined voltage level 420. This, and as shown in sixth plot 462 of graph 450, results in IO_header signal 316 (that is, header control signal 204) to change from a logic high to a logic low at the end of the power nap period T_nap. IO_header signal 316 changing to a logic low results in switching off of power control transistor 310. Hence, and in accordance with example embodiments, I/O header 106a or a portion of I/O header 106a is switched off when the cycle period of clock signal 202 is greater than the power nap period T_nap.

In addition, and as shown in seventh plot 464 of graph 450, switching off of power control transistor 310, results in VDD_IO signal 318 changing from a logic high to a logic low at the end of the power nap period T_nap. Hence, the virtual power supply signal (that is, VDD_IO signal 318) to I/O circuit 106 drops to a logic low when the cycle period of clock signal 202 is greater than the power nap period T_nap.

Continuing with FIG. 4B, and as shown in second plot 454 of graph 450, at the end of the first clock cycle period, PRE signal 314 rises to a logic high from a logic low in response to starting of a next clock cycle. This, and as shown third plot 456 and fourth plot 458 of graph 450, results in pre-charging of the bit line BL and the complementary bit line BLB. With the pre-charging of the bit line BL and the complementary bit line BLB, the remaining voltages on both of the bit line BL and the complementary bit line BLB rise above predetermined voltage level 420. Hence, and as shown in sixth plot 462 IO_header signal 316 (that is, header control signal 204) changes from a logic low to a logic high at a beginning of a next clock cycle which results in switching on of power control transistor 310 (that is, I/O header 106a).

Similarly, and as shown in seventh plot 464 of graph 450, switching on of power control transistor 310 causes VDD_IO signal 318 to change from a logic low to a logic high at a beginning of a next clock cycle. That is, the virtual power supply signal to I/O circuit 106 rises to a logic high at the end of the power nap period T_nap. Hence, I/O circuit header 106a is switched off from an end of the power control period T_nap to an end of a current clock cycle or a beginning of a next clock cycle for clock signal 202. By extension, the virtual power supply to I/O circuit 106 is disconnected from an end of the power control period T_nap to an end of a current clock cycle or a beginning of a next clock cycle for clock signal 202.

Figure 5:
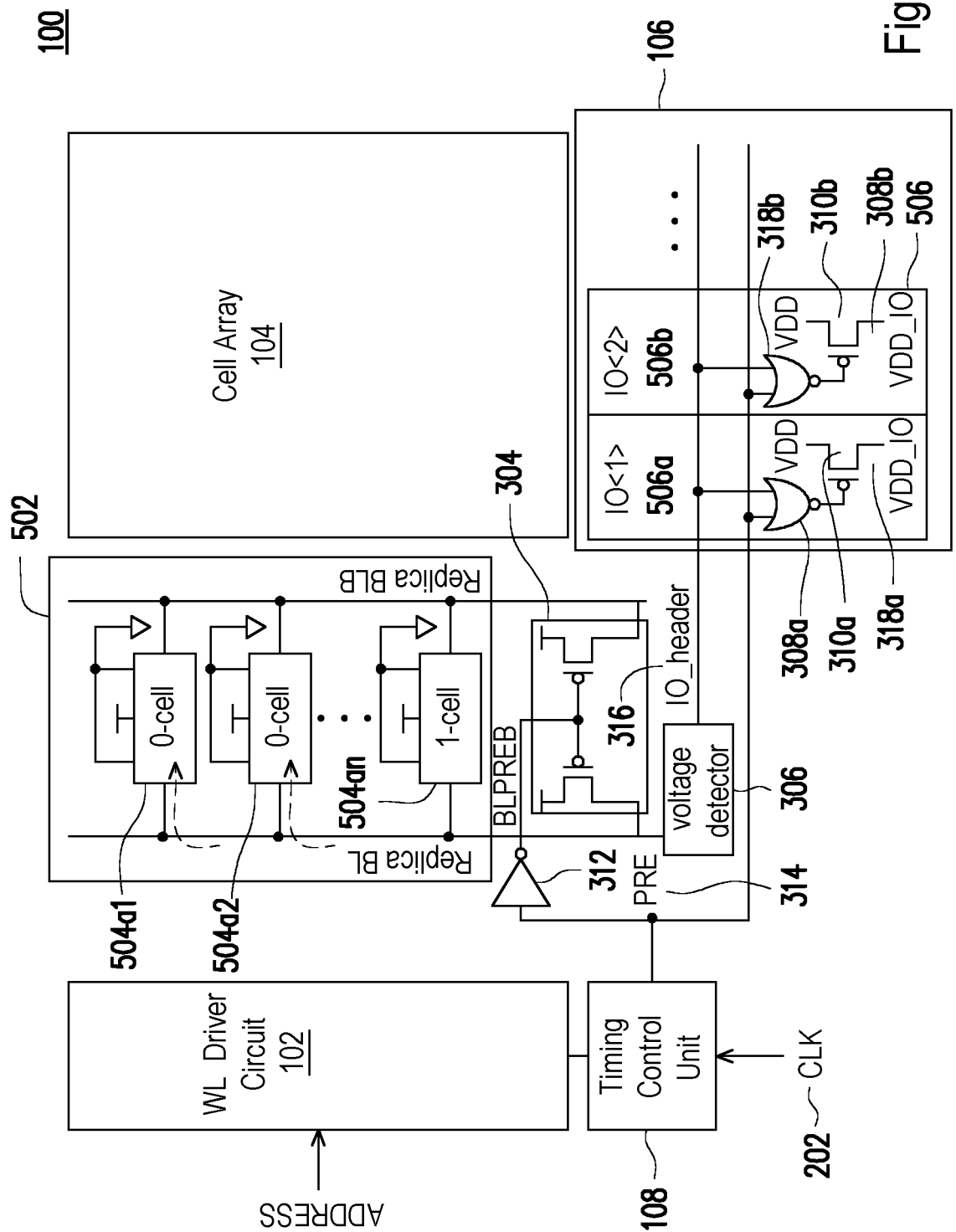
FIG. 5 is a diagram illustrating a memory device with another example header power control mechanism in a nap mode, in accordance with some embodiments.

FIG. 5 is a diagram of memory device 100 with another example header power control mechanism in a nap mode, in accordance with some embodiments. As shown in FIG. 5, memory device 100 includes word line driver circuit 102, cell array 104, I/O circuit 106, and timing control unit 108. In addition, and as shown in FIG. 5, memory device 100 includes a replica column 502, pre-charge circuit 304, and voltage detector 306. Moreover, it will be apparent to a person with ordinary skill in the art after reading this disclosure that memory device 100 can include more components or fewer components than those shown in FIG. 5.

I/O circuit 106 is shown to include a group of components 506. Group of components 506 is further shown to include a first sub-group of components 506a (also labeled to as I/O<1>) and a second sub-group of components 506b (also labeled to as I/O<2>). Although I/O circuit 106 of FIG. 5 illustrates only one group of components and two sub-group of components, it will be apparent to a person with an ordinary skill in the art after reading this disclosure that I/O circuit 106 can include more than one group of components and more than two sub-group of components.

The virtual power supply to first sub-group of components 506a (that is, first VDD_IO signal 318a) is controlled by a first power control transistor 308a (also referred to as a first header). The virtual power supply to second sub-group of components 506b (that is, second VDD_IO signal 318b) is controlled by a second power control transistor 308b (also referred to as a second header). Both the first header and the second header are controlled by IO_header signal 316. However, it will be apparent to a person with the skill in the art after reading this disclosure that the first header and the second header can be controlled independent of each other through a first IO_header signal and a second IO_header signal respectively.

Replica column 502 includes a plurality of cells labeled as 504a1, 504a2, . . . , 504an. In example embodiments, and as explained in greater detail with reference to FIGS. 7A, 7B, 7C, and 7D, each of the plurality of cells of replica column 502 are forced to store either a bit value of 0 (referred to as 0-cell) or a bit value of 1 (referred to as 1-cell). Each of the plurality of cells are connected to a replica bit line BL and a replica complementary bit line BLB. The replica bit line BL and the replica complementary bit line BLB are both connected to pre-charge circuit 304. Pre-charge circuit 304 is connected to a first output terminal of timing control unit 108 through NOT logic circuit 312. Voltage detector 306 is connected to the replica bit line BL. However, it will be apparent to a person with ordinary skill in the art after reading this disclosure that voltage detector 306 can be connected to the replica complementary bit line BLB.

For a read or a write operation, timing control unit 108 generates PRE signal 314 at first output terminal. In examples, PRE signal 314 rises to a logic high when clock signal 202 rises to a logic high. This causes pre-charge circuit 304 to pre-charge each of the replica bit line BL and the replica complementary bit line BLB to a predetermined voltage by connecting each of the replica bit line BL and the replica complementary bit line BLB to a supply voltage (that is, VDD). After a predetermined time, PRE signal 314 drops to a logic low which causes each of the replica bit line BL and the replica complementary bit line BLB to be disconnected from the supply voltage (that is, VDD). After being disconnected from the supply voltage (that is, VDD), each of the replica bit line BL and replica complementary bit line BLB starts to discharge through the plurality of cells labeled as 504a1, 504a2, . . . , 504an. In example embodiments, a rate of discharge for the replica bit line BL and the replica complementary bit line BLB is dependent on a total number of the plurality of cells connected in replica column 502. In addition, the rate of discharge is also dependent on a ratio of a number of 0-cells and a number of 1-cells which are connected in replica column 502.

Voltage detector 306 is connected to the replica bit line BL and continuously compares a remaining voltage on the replica bit line BL with predetermined voltage level 420. However, it will be apparent to a person with an ordinary skill in the art after reading this disclosure that voltage detector 306 can be connected to the replica complementary bit line BL and continuously compare a remaining voltage on the replica bit line BL with predetermined voltage level 420.

When the remaining voltage on the replica bit line BL is above predetermined voltage level 420, an output terminal of voltage detector 306 (that is, IO_header signal 316 or header control signal 204)) is at a logic high. By extension, the first input terminal of each of first NOR logic circuit 308a and second NOR logic circuit 308b is at a logic high. And therefore, an output of each of first NOR logic circuit 308a and second NOR logic circuit 308b (that is, the output terminal of each of first NOR logic circuit 308a and second NOR logic circuit 308b) is at a logic low. When the output terminal of each of first NOR logic circuit 308a and second NOR logic circuit 308b is at a logic low, the gates of each of first power control transistor 310a and second power control transistor 310b are at a logic low which switches on both first power control transistor 310a and second power control transistor 310b. Hence, both the first header (that is, first power control transistor 310a) and the second header (that is, second power control transistor 310b) remain switched on when a remaining voltage on the replica bit line BL stays above predetermined voltage level 420.

By extension, the drains of each of first power control transistor 310a and second power control transistor 310b are connected to the supply voltage (that is, VDD) and remain at a logic high. This causes, VDD_IO signal 318 (that is, the virtual power supply signal) for both first sub-group of components 506a (that is, IO<1>) and second sub-group of components 506b (that is, IO<2>) to remain at a logic high. Therefore, the virtual power supply for each of first sub-group of components 506a and second sub-group of components 506b remain at a logic high when a remaining voltage on the replica bit line BL remain above predetermined voltage level 420.

However, when a remaining voltage on the replica bit line BL drops below predetermined voltage level 420, the output terminal of voltage detector 306 (that is, IO_header signal 316 or header control signal 204) drops to a logic low. By extension, the first input terminal of each of first NOR logic circuit 308a and second NOR logic circuit 308b is also at a logic low which drives an output of each of first NOR logic circuit 308a and second NOR logic circuit 308b to a logic high. That is, the output terminal of each of first NOR logic circuit 308a and second NOR logic circuit 308b rises to a logic high. When the output terminals of first NOR logic circuit 308a and second NOR logic circuit 308b are at a logic high, the gate of each of first power control transistor 310a and second power control transistor 310b is at a logic high which causes both first power control transistor 310a (that is, the first header) and second power control transistor 310b (that is, the first header) to switch off. Thus, and in accordance with example embodiments, the headers of each of first sub-group of components 506a and second sub-group of components 506b of I/O circuit 106 are switched off from the power nap period T_nap till the beginning of a next clock cycle of clock signal 202.

Switching off of each of first power control transistor 310a and second power control transistor 310b causes a drain of each of first power control transistor 310a and second power control transistor 310b (that is, each of first VDD_IO signal 318a and second VDD_IO signal 318b) to drop to a logic low. That is, the virtual power supply signal to each of first sub-group of components 506a and second sub-group of components 506b of I/O circuit 106 also drops to a logic low from the power nap period T_nap till the beginning of a next clock cycle of clock signal 202.

Figure 6:
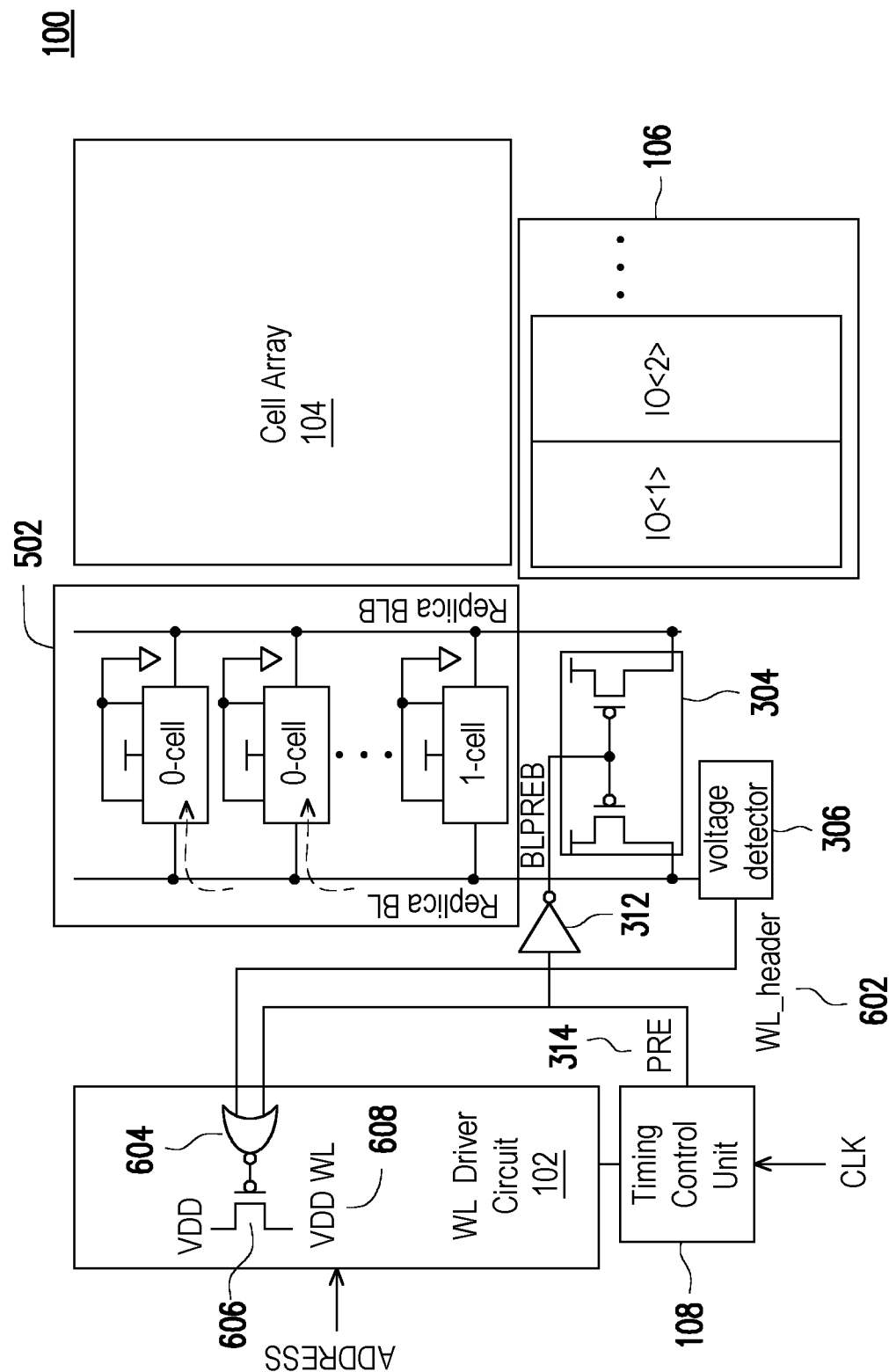
FIG. 6 is a diagram illustrating a memory device with yet another example header power control mechanism in a nap mode, in accordance with some embodiments.

Power control circuit 110 is also used to control a header or a portion of a header of word line drive circuit 102. For example, FIG. 6 illustrates memory device 100 with a power control mechanism for switching off a header or a portion of a header of word line driver circuit 102, in accordance with example embodiments. As shown in FIG. 6, memory device 100 includes word line driver circuit 102, cell array 104, I/O circuit 106, and timing control unit 108. In addition, and as shown in FIG. 6, memory device 100 includes replica column 502, pre-charge circuit 304, voltage detector 306, and a NOT logic circuit 312. Moreover, memory device 100 of FIG. 6 includes a NOR logic circuit 604, and a power control transistor 606. Power control transistor 606 forms word line driver header 102a or a portion of word line driver header 102a. It will be apparent to a person with ordinary skill in the art after reading this disclosure that memory device 100 can include more components or fewer components than those shown in FIG. 5.

Replica column 502 includes replica bit line BL and replica complementary bit line BLB which are connected to pre-charge circuit 304. Pre-charge circuit 304 is connected to a first output terminal of timing control unit 108 through NOT logic circuit 312. Voltage detector 306 is connected to the replica bit line BL. However, it will be apparent to a person with ordinary skill in the art after reading this disclosure that voltage detector 306 can be connected to the replica complementary bit line BLB.

An output of voltage detector 306 is connected to a first input of a NOR logic circuit 604. Voltage detector 306 and NOR logic circuit 604 can form power control circuit 110. A second input terminal of NOR logic circuit 604 is connected to a first output terminal of timing control unit 108. The first output terminal of timing control unit 108 is also connected to an input terminal of NOT logic circuit 312. A second output terminal of timing control unit is connected to word line driver circuit 102.

An output terminal of NOR logic circuit 604 is connected to a gate of power control transistor 606 (that is, word line driver header 104a or a portion of word line driver header 104a). A source of power control transistor 606 is connected to a supply voltage (that is, VDD) and a drain of power control transistor 606 is connected to word line driver circuit 104. Power control transistor 606 is a pMOS transistors. However, it will be apparent to a person with ordinary skill in the art after reading this disclosure power control transistor 606 can be a MOSFET, an nMOS transistor, or a CMOS transistor. In addition, power control transistor 606 is symmetrical. That is, a source of power control transistor 606 can be a drain, and a drain can be a source.

For a read or a write operation, timing control unit 108 generates a PRE signal 314 at first output terminal. In examples, PRE signal 314 rises to a logic high when clock signal 202 rises to a logic high. Rising of PRE signal 314 to logic high causes each of the replica bit line and the replica complementary bit line BLB to be connected to a supply voltage (that is, VDD) through pre-charge circuit 304. This causes each of the replica bit line BL and the replica complementary bit line BLB to be pre-charged to a predetermined potential or a predetermined voltage. After a predetermined time, PRE signal 314 drops to a logic low which causes each of the replica bit line BL and the replica complementary bit line BLB to be disconnected from the supply voltage (that is, VDD).

After being disconnected from the supply voltage (that is, VDD), each of the replica bit line BL and replica complementary bit line BLB starts to discharge. For example, the replica bit line BL and replica complementary bit line BLB discharge through a plurality of 0-cells and 1-cells connected to the replica bit line BL and replica complementary bit line BLB. A rate of discharge of the replica bit line BL and replica complementary bit line BLB depends on a number of a plurality of 0-cells and 1-cells connected to the replica bit line BL and replica complementary bit line BLB.

Voltage detector 306 continuously compares a remaining voltage on the replica bit line BL with predetermined voltage level 420. When the voltage on the replica bit line BL is above predetermined voltage level 420, an output terminal of voltage detector 306 (that is, WL_header signal 602 or header control signal 204) is at a logic high. By extension, the first input terminal of NOR logic circuit 604 is at a logic high which causes an output of NOR logic circuit 604 (that is, the output terminal of NOR logic circuit 604) to be at a logic low. When the output terminal of NOR logic circuit 604 is at a logic low, a gate of power control transistor 606 is at a logic low which switches on power control transistor 606. Therefore, power control transistor 606 (that is, word line driver header 102a) remains switched on when a remaining voltage on the replica bit line BL is above predetermined voltage level 420. In addition, switching on of power control transistor 606 causes a drain of power control transistor 606 to be connected to the supply voltage (that is, VDD) and to be at a logic high. This causes VDD_WL signal 608 (that is, the virtual power supply signal) to word line driver circuit 102 to be at a logic high.

However, when a remaining voltage on the replica bit line BL drops below predetermined voltage level 420 (at the power nap period T_nap), the output terminal of voltage detector 306 (that is, WL_header signal 602 or power control signal 204) drops to a logic low. This causes the first input terminal of NOR logic circuit 604 to be at a logic low which drives an output of NOR logic circuit 604 (that is, the output terminal of NOR logic circuit 604) to a logic high. When the output terminal of NOR logic circuit 604 is at a logic high, the gate of power control transistor 606 is at a logic high which switches off power control transistor 606 (that is, word line driver header 102a or a portion of word line driver header 104a).

Thus, and in accordance with example embodiments, when a remaining voltage on the replica bit line BL drops below predetermined voltage level 420 during a clock cycle, a header or a portion of a header of word line driver circuit 102 is switched off from the power nap period T_nap till the beginning of a next clock cycle of clock signal 202. Switching off of power control transistor 606 causes the drain of power control transistor 606, and by extension, VDD_WL signal 608 to drop to a logic low. That is, and in accordance with example embodiments, when a remaining voltage on the replica bit line BL drops below predetermined voltage level 420 during a clock cycle, the virtual power supply signal to word line driver circuit 102 drops to a logic low from the power nap period T_nap till the beginning of a next clock cycle of clock signal 202.

In example embodiments, power control transistor 606 is a p-channel metal oxide semiconductor (pMOS) transistors. However, other types of transistors are within the scope of the disclosure. For example, power control transistor 606 can be a MOSFET, an nMOS transistor, or a MOS transistor. In addition, power control transistor 606 is symmetrical. That is, a source of power control transistor 606 can be a drain, and a drain can be a source.

Figure 7A:
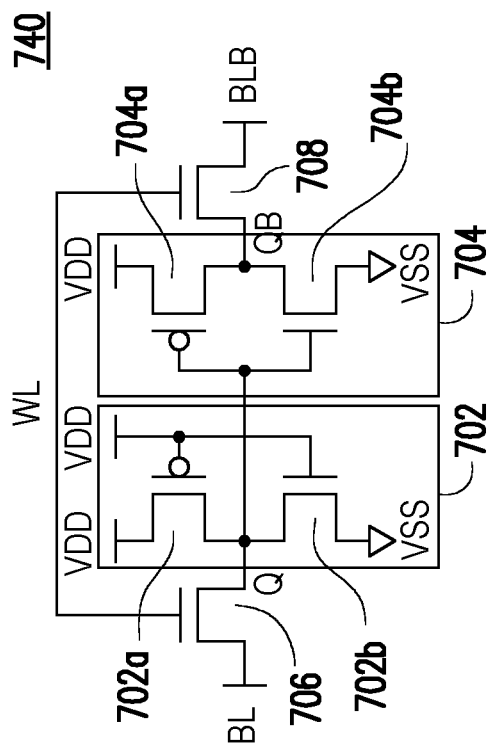
FIG. 7A is a diagram of a first type of 0-cell in accordance with some embodiments of the disclosure.

FIG. 7A is a diagram 700 of a first type of 0-cell in accordance with some embodiments of the disclosure. As shown in FIG. 7A first type of 0-cell includes a first invertor 702 and a second invertor 704. First invertor 702 includes a first invertor first transistor 702a and a first invertor second transistor 702b. First invertor first transistor 702a is a pMOS transistor and first invertor second transistor 702b is an nMOS transistor. A source of first invertor first transistor 702a is connected to a supply voltage (that is, VDD) and a drain of first invertor first transistor 702a is connected to a Q node. A source of first invertor first transistor 702a is connected to the Q node and a drain of first invertor first transistor 702a is connected to ground (that is, VSS). A gate of each of first invertor first transistor 702a and first invertor second transistor 702b is connected to a supply voltage (that is, VDD). The Q node is connected to the replica bit line BL through a first access transistor 706.

Second invertor 704 includes a second invertor first transistor 704a and a second invertor second transistor 704b. Second invertor first transistor 704a is a pMOS transistor and second invertor second transistor 704b is an nMOS transistor. A source of second invertor first transistor 704a is connected to a supply voltage (that is, VDD) and a drain of second invertor first transistor 704a is connected to a QB node. A source of second invertor first transistor 704a is connected to the QB node and a drain of second invertor first transistor 704a is connected to ground (that is, VSS). A gate of each of second invertor first transistor 704a and second invertor second transistor 704b is connected to ground (that is, VSS). The QB node is connected to the replica complementary bit line BLB through a second access transistor 708. A gate of each of first access transistor 706 second access transistor 708 is connected to a word line WL.

As shown in diagram 700 of FIG. 7A, first type of 0-cell is forced to store a bit value of 0 at the Q node and a bit value of 1 at the QB node. That is, in the first type of 0-cell, the Q node is forced to remain at a logic 0 and the QB node is forced to remain at a logic 1. In example embodiments, other types of transistors, that is, a MOSFET, an nMOS transistor, a pMOS transistors, or a CMOS transistor can be used for each of first invertor first transistor 702a, first invertor second transistor 702b, second invertor first transistor 704a, second invertor second transistor 704b, first access transistor 706, and second access transistor 708. In addition, each of first invertor first transistor 702a, first invertor second transistor 702b, second invertor first transistor 704a, second invertor second transistor 704b, first access transistor 708, and second access transistor 708 is symmetrical. That is, a source can be a drain, and a drain can be a source.

Figure 7C:
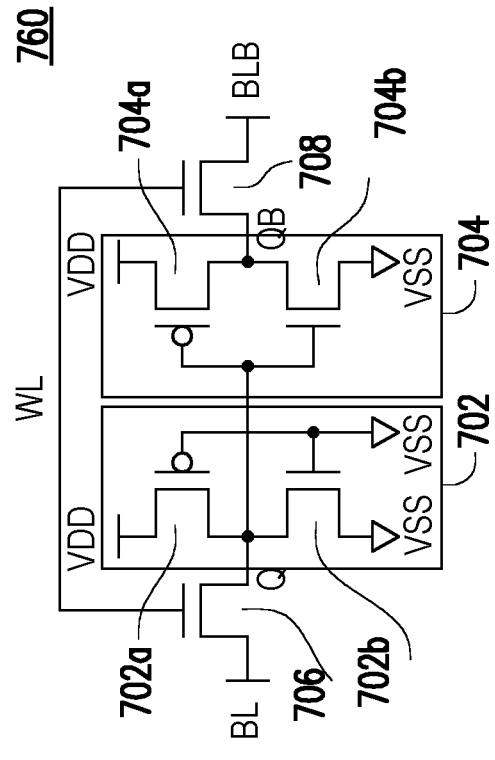
FIG. 7C is a diagram of a first type of 1-cell in accordance with some embodiments of the disclosure.
Figure 7B:
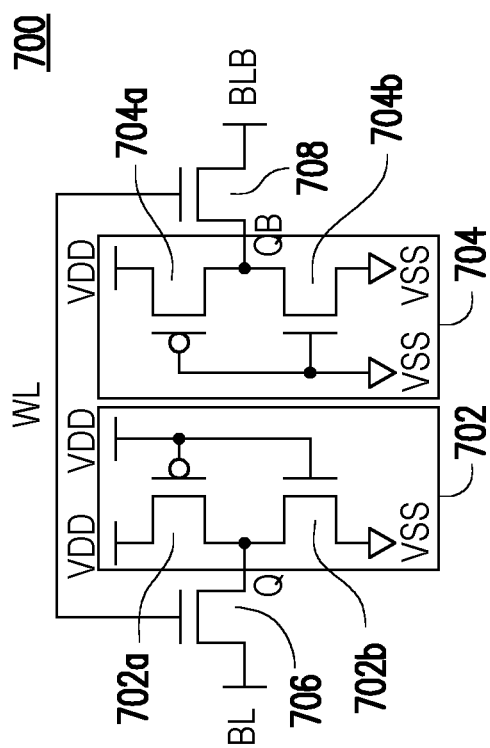
FIG. 7B is a diagram of a second type of 0-cell in accordance with some embodiments of the disclosure.

FIG. 7B is a diagram 720 of a first type of 1-cell in accordance with some embodiments of the disclosure. As shown in FIG. 7B, first type of 1-cell also includes first invertor 702 and second invertor 704. However, for the first type of 1-cell, a gate of each of first invertor first transistor 702a and first invertor second transistor 702b is connected to ground (that is, VSS). In addition, a gate of each of second invertor first transistor 704a and second invertor second transistor 704b is connected to supply voltage (that is, VDD). Hence, first type of 1-cell is forced to store a bit value of 1 at the Q node and a bit value of 0 at the QB node.

FIG. 7C is a diagram 740 of a second type of 0-cell in accordance with some embodiments of the disclosure. As shown in FIG. 7C, second type of 0-cell also includes first invertor 702 and second invertor 704. However, for the second type of 0-cell, a gate of each of first invertor first transistor 702a and first invertor second transistor 702b is connected to supply voltage (that is, VDD). In addition, a gate of each of second invertor first transistor 704a and second invertor second transistor 704b is connected to the Q node. Hence, second type of 0-cell is forced to store a bit value of 0 at the Q node and a bit value of 1 at the QB node.

Figure 7D:
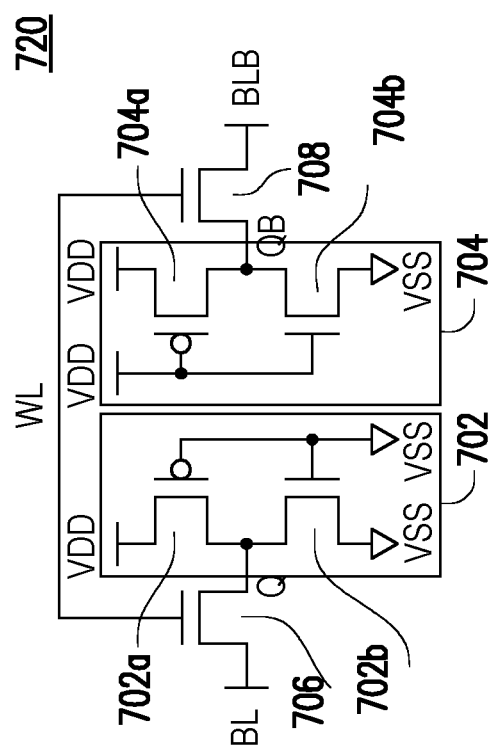
FIG. 7D is a diagram of a second type of 1-cell in accordance with some embodiments of the disclosure.

FIG. 7D is a diagram 760 of a second type of 1-cell in accordance with some embodiments of the disclosure. As shown in FIG. 7C, second type of 1-cell also includes first invertor 702 and second invertor 704. However, for the second type of 1-cell, a gate of each of first invertor first transistor 702a and first invertor second transistor 702b is connected to ground (that is, VSS). In addition, a gate of each of second invertor first transistor 704a and second invertor second transistor 704b is connected to the Q node. Hence, second type of 1-cell is forced to store a bit value of 1 at the Q node and a bit value of 0 at the QB node.

It will apparent to a person with the ordinary skill in the art that the first and the second types of 0-cells and 1-cells described with reference with FIGS. 7A, 7B, 7C, and 7D are examples only, and other types of 0-cells and 1-cells are within the scope of the disclosure.

FIG. 8A is a graph 800 illustrating clock signal 202 at a first frequency and other signals of memory device 100 of FIGS. 5 and 6 corresponding to clock signal 202 at the first frequency, in accordance with some embodiments. For example, a first plot 802 of graph 800 is a representative of clock signal 202, a second plot 804 of graph 800 is a representative of PRE signal 314, a third plot 806 of graph 800 is a representative of a remaining voltage on the replica bit line BL, and a fourth plot 808 of graph 800 is a representative of both VDD_IO signal 318 and VDD_WL signal 608.

As shown first plot 802 and second plot 804 of graph 800 of FIG. 8A, PRE signal 314 rises to a logic high when clock signal 202 rises to a logic high. In addition, and as shown in third plot 806, the remaining voltage on the replica bit line BL starts to drop when PRE signal 314 drops to a logic low from a logic high. PRE signal 314 changes to a logic low after pre-charging both of the replica bit line BL.

However, and as shown third plot 806, the remaining voltage on the replica bit line BL does not drop below predetermined voltage level 420 before clock signal 202 rises to a logic high for a next clock cycle. And when clock signal 202 rises to a logic high for a next clock cycle, the remaining voltage on the replica bit line BL are pre-charged to a logic high. Hence, and as shown in fourth plot 808, both VDD_IO signal 318 and VDD_WL signal 608, remain at a logic high indicating that the headers of I/O circuit 106 and word line driver circuit 102 remain switched on. Hence, in accordance with example embodiments, the headers I/O circuit 106 word line driver circuit 102 remain switched on for entire clock cycle when the cycle period of clock signal 202 is less than the power nap period T_nap.

FIG. 8B is a graph 850 illustrating clock signal 202 at a second frequency and other signals of memory device 100 corresponding to clock signal 202 at the second frequency, in accordance with some embodiments. For example, a first plot 852 of graph 850 is a representative of clock signal 202 at a second frequency, a second plot 854 of graph 850 is a representative of PRE signal 314, a third plot 856 of graph 850 is a representative of a remaining voltage on the replica bit line BL, a fourth plot 858 of graph 850 is a representative of both IO_header signal 316 and WL header signal 602, and a fifth plot 860 of graph 850 is representative of both VDD_IO signal 318 and VDD_WL signal 608.

As shown first plot 852 of FIG. 8B, the second frequency of clock signal 202 is lower than the first frequency associated depicted in first plot 802 of FIG. 8A. Therefore, a clock cycle period T2 for clock signal 202 corresponding to the second frequency is greater than the clock cycle period T1 of clock cycle 202 at the first. The longer clock cycle period provides, and as shown in a third plot 856 of graph 850, sufficient time (that is, the power nap period T_nap) for the remaining voltage on the replica bit line BL to drop below predetermined voltage level 420. This, and as shown in fourth plot 858 of graph 850, causes in both IO_header signal 316 and WL_header signal 602 changing from a logic high to a logic low at the end of the power nap period T_nap. In response, and as shown in fifth plot 860 of graph 850, both VDD_IO signal 318 and VDD_WL signal 608 change from a logic high to a logic low at the end of the power nap period T_nap.

Change of VDD_IO signal 318 and VDD_WL signal 608 from a logic high to a logic low causes headers of or portions of headers of I/O circuit 106 (that is, first power control transistor 310a and second power control transistor 310b) and headers of or portions of headers word line driver circuit 102 (that is, power control transistor 606) to be switched off at the end of the power nap period T_nap. Thus, and in accordance with example embodiments, headers of or portions of the headers of I/O circuit 106 are switched off when after the power nap period T_nap when the cycle period of clock signal 202 is greater than the power nap period T_nap. In addition, and in accordance with example embodiments, headers of or portions of the headers of word line driver circuit 102 are switched off when after the power nap period T_nap when the cycle period of clock signal 202 is greater than the power nap period T_nap.

Continuing with FIG. 8B, and as shown in second plot 854 of graph 850, at the end of the first clock cycle period, PRE signal 314 rises from a logic low to a logic high in response to starting of a next clock cycle. This, and as shown third plot 856 of graph 850, results in pre-charging of the replica bit line BL. With the pre-charging of the replica bit line BL, a remaining voltage on the replica bit line BL rises above predetermined voltage level 420. Hence, and as shown in fourth plot 858 and fifth plot 860 of graph 850, both IO_header signal 316 and VDD_IO signal 318 change from a logic low to a logic high. In addition, and as shown in fourth plot 858 and fifth plot 860 of graph 850, both WL_header signal 602 and VDD_WL signal 608 change from a logic low to a logic high. IO_header signal 316 rising to a logic high results in switching back on of the headers of first sub-group of components 506a and second sub-group of components 506b. Similarly, WL_header signal 602 rising to a logic high results in switching back on of the headers of word line driver circuit 102. Hence, and in accordance with example embodiments, the headers of first sub-group of components 506a and second sub-group of components 506b, and the headers word line driver circuit 102 are switched off from an end of the power control period T_nap to an end of a cycle period.

Figure 9:
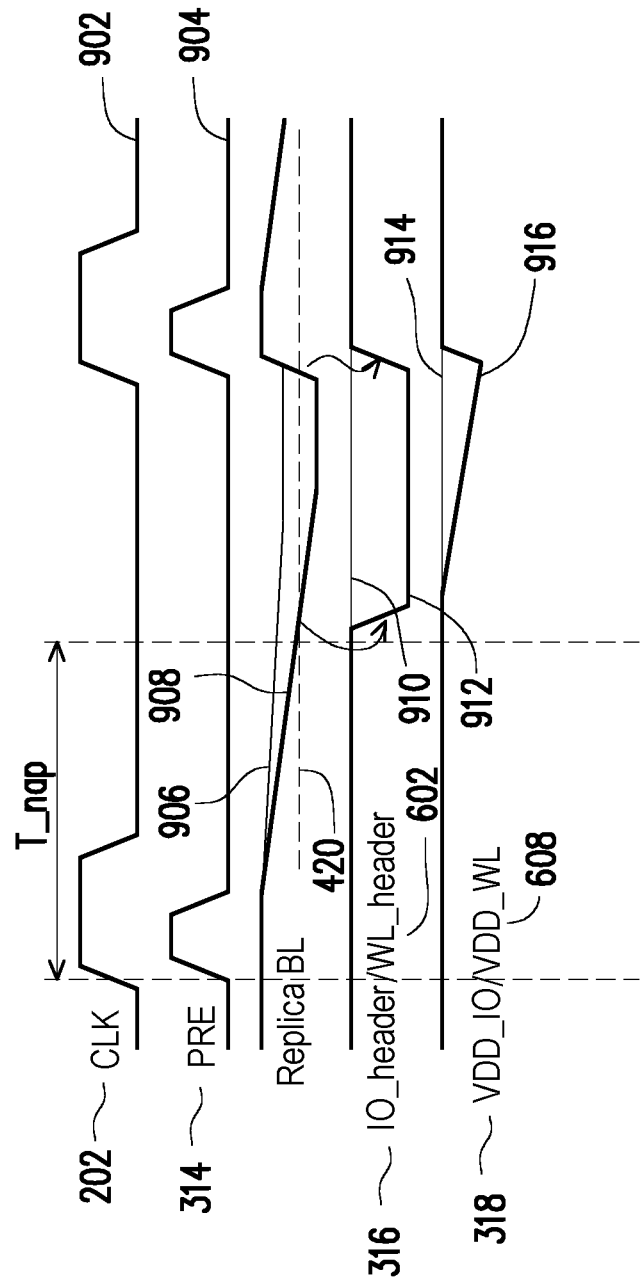
FIG. 9 is a graph illustrating a clock signal and other signals of memory device of FIGS. 5 and 6 corresponding to a different number of 0-cells, in accordance with some embodiments.

FIG. 9 is a graph 900 illustrating clock signal 202 and other signals of memory device 100 of FIGS. 5 and 6 corresponding to a different number of 0-cells connected to the replica bit line BL, in accordance with some embodiments. For example, a first plot 902 of graph 900 is a representative of clock signal 202 and a second plot 904 of graph 900 is a representative of PRE signal 314. In addition, a third plot 906 of graph 900 is a representative of a remaining voltage on the replica bit line BL with a first plurality of 0-cells. Moreover, a fourth plot 908 of graph 900 is a representative of a remaining voltage on the replica bit line BL with a second plurality of 0-cells.

A fifth plot 910 of graph 900 is a representative of both IO_header signal 316 and WL header signal 602 corresponding to the replica bit line BL with the first plurality of 0-cells. Moreover, a sixth plot 912 of graph 900 is a representative of both IO_header signal 316 and WL header signal 602 corresponding to the replica bit line BL with the second plurality of 0-cells. Furthermore, a seventh plot 914 of graph 900 is representative of both VDD_IO signal 318 and VDD_WL signal 608 corresponding to the replica bit line BL with the first plurality of 0-cells. In addition, an eighth plot 916 of graph 900 is representative of both VDD_IO signal 318 and VDD_WL signal 608 corresponding to the replica bit line BL with the second plurality of 0-cells. The second plurality of 0-cells includes more number of 0-cells than the first plurality of 0-cells with a same number of 1-cell.

As shown first plot 902 and second plot 904 of graph 900 of FIG. 9, PRE signal 314 rises to a logic high when clock signal 202 rises to a logic high. In addition, and as shown in third plot 906 and fourth plot 908, the voltage on the replica bit line BL starts to drop when PRE signal 314 drops to a logic low from a logic high. However, and as shown third plot 906 and fourth plot 908, the voltage on the replica bit line BL with the first plurality of 0-cells drops at slower rate the replica bit line BL with the second plurality of 0-cells. PRE signal 314 changes to a logic low after pre-charging both of the replica bit line BL.

The slower discharge rate, and as shown in a third plot 906 of graph 900, does not provide a sufficient time (that is, the power nap period T_nap) for the remaining voltage on the replica bit line BL with the first plurality of 0-cells to drop below predetermined voltage level 420 before beginning of a next clock cycle. And when clock signal 202 rises to a logic high for the next clock cycle, the remaining voltage on both the bit line BL with the first plurality of 0-cells and the bit line BL with the second plurality of 0-cells starts to rise. Hence, and as shown in fifth plot 910, both IO_header signal 316 and WL_header signal 602 remain at a logic high. And by extension, both VDD_IO signal 318 and VDD_WL signal 608 also remain at a logic high. Hence, the headers first sub-group of components 506a, second sub-group of components 506b, and word line driver circuit 102 remain switched on for the starting of the next clock cycle. That is, the headers of first sub-group of components 506a, second sub-group of components 506b, and word line driver circuit 102 remain switched on when the replica bit line BL is associated with the first plurality of 0-cells for a cycle period of clock signal 202.

On the contrary, a faster discharge rate, as shown in a fourth plot 908 of graph 900, provides a sufficient time (that is, the power nap period T_nap) for the remaining voltage on the replica bit line BL with the second plurality of 0-cells to drop below predetermined voltage level 420 before beginning of a next clock cycle. Hence, and as shown in sixth plot 912, both IO_header signal 316 and WL_header signal 602 drop from a logic high to a logic low. And by extension, both VDD_IO signal 318 and VDD_WL signal 608 drop to a logic low at the end of the power nap period T_nap. In response, and as shown in eighth plot 916 of graph 900, both VDD_IO signal 318 and VDD_WL signal 608 change from a logic high to a logic low at the end of the power nap period T_nap. Changing of IO_header signal 316 to a logic low results in switching off of first power control transistor 310a and second power control transistor 310b (that is, the headers of or portions of the headers of first sub-group of components 506a, second sub-group of components 506b). Similarly, changing of WL_header signal 602 to a logic low results in switching off of power control transistor 606 (that is, the headers of or portions of the headers of word line driver circuit 102).

Continuing with FIG. 9, and as shown in second plot 904 of graph 900, at the end of the first clock cycle period, PRE signal 314 rises from a logic low to a logic high in response to starting of a next clock cycle. This, and as shown fourth plot 908 of graph 900, results in pre-charging of the replica bit line BL with the second plurality of 0-cells. With the pre-charging of the replica bit line BL with the second plurality of 0-cells, the remaining voltage on the replica bit line BL with the second plurality of 0-cells rises above predetermined voltage level 420. Hence, and as shown in sixth plot 912 and eighth plot 916 of graph 900, both IO_header signal 316 and VDD_IO signal 318 change from a logic low to a logic high. In addition, and as shown in sixth plot 912 and eighth plot 916 of graph 900, both WL_header signal 602 and VDD_WL signal 608 change from a logic low to a logic high.

IO_header signal 316 rising to a logic high results in switching back on of first power control transistor 310a and second power control transistor 310b (that is, the headers of first sub-group of components 506a and the headers of second sub-group of components 506b). Similarly, WL_header signal 602 rising to a logic high results in switching on of power control transistor 606 (that is, the headers of word line driver circuit 102). Hence, the headers of or portions of the headers of first sub-group of components 506a, second sub-group of components 506b, and word line driver circuit 102 are switched off from an end of the power control period T_nap to an end of a cycle period for clock signal 202 for the replica bit line BL with the second plurality of 0-cells.

Hence, for a same frequency of clock signal 202, a more number of 0-cells connected to the replica bit line BL increases a discharge rate of the replica bit line BL thereby reducing the power control period T_nap. Therefore, in accordance with example embodiment, the power control period T_nap can be controlled by controlling a number of 0-cells or 1-cells connected to the replica bit line BL.

Figure 10:
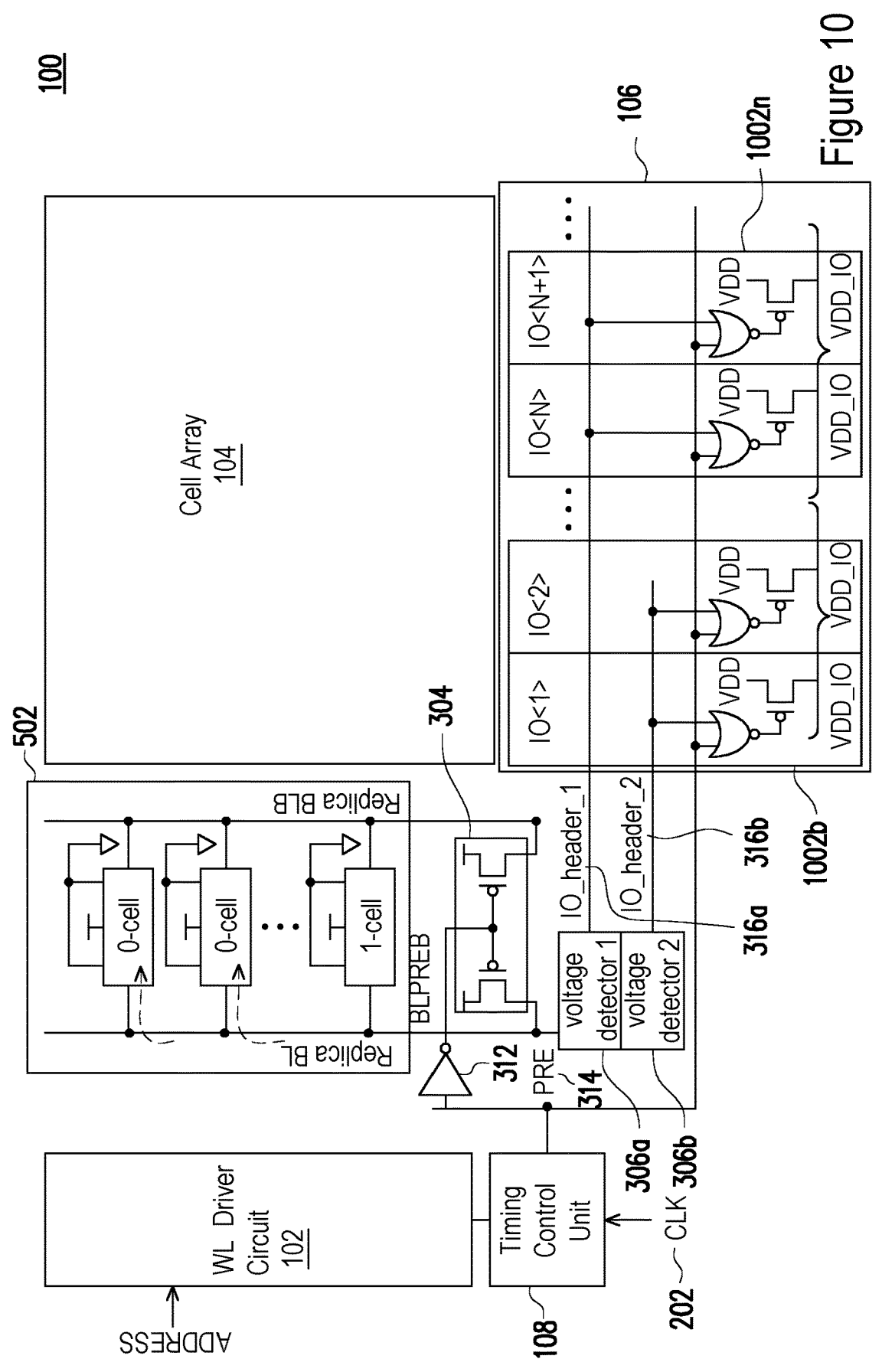

FIG. 10 is a diagram of memory device 100 with another example header power control mechanism in a nap mode, in accordance with some embodiments. As shown in FIG. 10, memory device 100 includes word line driver circuit 102, cell array 104, I/O circuit 106, and timing control unit 108. In addition, and as shown in FIG. 10, memory device 100 includes a replica column 502, pre-charge circuit 304, a first voltage detector 306a, and a second voltage detector 306b. Moreover, it will be apparent to a person with ordinary skill in the art after reading this disclosure that memory device 100 can include more components or fewer components than those shown in FIG. 10.

I/O circuit 106 is shown to include first group of components 1002a and an nth group of components 1002n. A header for first group of components 1002a is controlled by a IO_header_1 signal 316a and a header for nth group of components 1002n is controlled by a IO_header_2 signal 316b. In addition, IO_header_1 signal 316a is generated by first voltage detector 306a and IO_header_2 signal 316b is generated by second voltage detector 306b. It will be apparent to a person with ordinary skill in the art after reading this disclosure that I/O circuit 106 can include more than two groups of components and more than two voltage detector circuits 306.

Pre-charge circuit 304 is connected to the first output terminal of timing control unit 108 through NOT logic circuit 312. Each of first voltage detector 306a and second voltage detector 306b is connected to the replica bit line BL. However, it will be apparent to a person with ordinary skill in the art after reading this disclosure that both of or one of first voltage detector 306a and second voltage detector 306b can be connected to the replica complementary bit line BLB.

Each of first voltage detector 306a and second voltage detector 306b is associated with a different predetermined voltage levels. For example, first voltage detector 306a is associated with a first predetermined voltage level for generating IO_header_1 signal 316a and second voltage detector 306b is associated with a second predetermined voltage level for generating IO_header_2 signal 316b. The first predetermined voltage level is different from the second predetermined voltage level. For example, the first predetermined voltage level is greater than or more than the second predetermined voltage level.

In example embodiments, when the voltage of the replica bit line BL drops below the first predetermined voltage level, an output terminal of first voltage detector 306a drops to logic low which results in IO_header_1 signal 316a dropping to a logic low. IO_header_1 signal 316a dropping to a logic low causes switches of the headers or portions of the headers associated with first group of components 1002a of I/O circuit 106. Similarly, when the voltage of the replica bit line BL drops below the second predetermined voltage level, an output terminal of second voltage detector 306b drops to logic low which results in IO_header_2 signal 316b dropping to a logic low. IO_header_2 signal 316b dropping to a logic low which results in switching off of the headers or portions of the headers associated with second group of components 1002b of I/O circuit 106.

Figure 11:
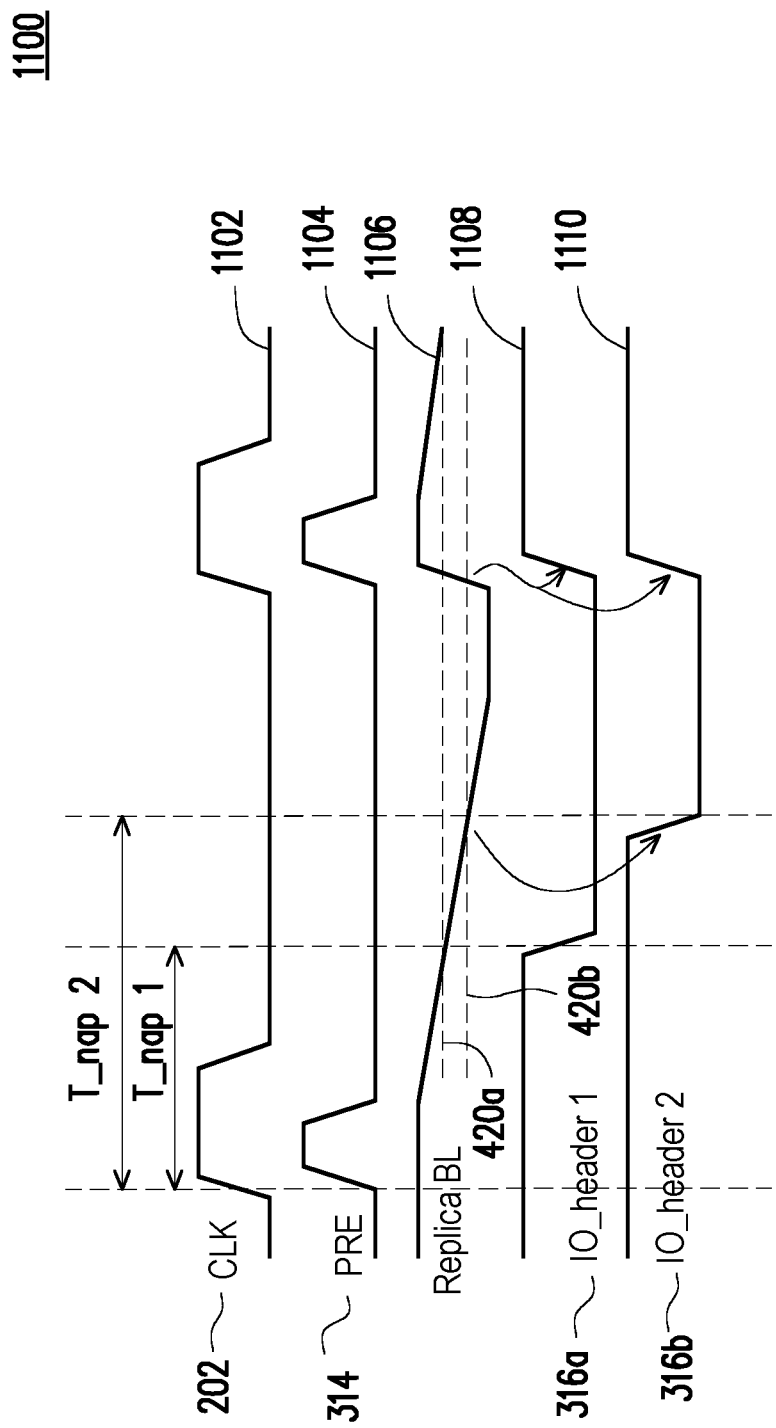
FIG. 11 is a graph illustrating a clock signal and other signals of memory device of FIG. 10 corresponding to the clock signal, in accordance with some embodiments.

FIG. 11 is a graph 1100 illustrating clock signal 202 and other signals of memory device 100 of FIG. 10 corresponding to clock signal 202, in accordance with some embodiments. For example, a first plot 1102 of graph 1100 is a representative of clock signal 202 and a second plot 1104 of graph 1100 is a representative of PRE signal 314. A third plot 1106 of graph 1100 is a representative of a remaining voltage on the replica bit line BL. A fourth plot 1108 of graph 1100 is a representative of IO_header_1 signal 316a and a fifth plot 1110 of graph 1100 is a representative of IO_header_2 signal 316b.

As shown first plot 1102 and second plot 1104 of graph 1100 of FIG. 11, PRE signal 314 rises to a logic high when clock signal 202 rises to a logic high. In addition, and as shown in third plot 1106 of graph 1100, the remaining voltage on the replica bit line BL starts to drop when PRE signal 314 drops to a logic low from a logic high. PRE signal 314 changes to a logic low after pre-charging both of the replica bit line BL.

Continuing with FIG. 11, as shown in fourth plot 1108 of graph 1100, IO_header_1 signal 316a changes from a logic high to a logic low when the remaining voltage on the replica bit line BL drops below first predetermined voltage level 420a (at the end of a first power nap period T_nap 1 which corresponds to first voltage detector 306a). This results in switching off of the headers or portions of the headers of first group of component 1102a of I/O circuit 106.

In addition, and as shown in fifth plot 1110 of graph 1100, IO_header_2 signal 316b changes from a logic high to a logic low when the remaining voltage on the replica bit line BL drops below second predetermined voltage level 420b (at the end of a second power nap period T_nap 2 which corresponds to second voltage detector 306b). This results in switching off of the headers or portions of the headers of nth group of component 1102n of I/O circuit 106.

Thus, and in accordance with example embodiments, the headers of portions of the headers of different group of components of I/O circuit 104 (and by extension word line driver circuit and cell array 104) can be switched off at different power nap periods Tnaps and hence for a different amount of time. The switch off time for the headers associated with different group of components can be varied by varying predetermined voltage level 420 associated with different voltage detectors 306.

Figure 12:
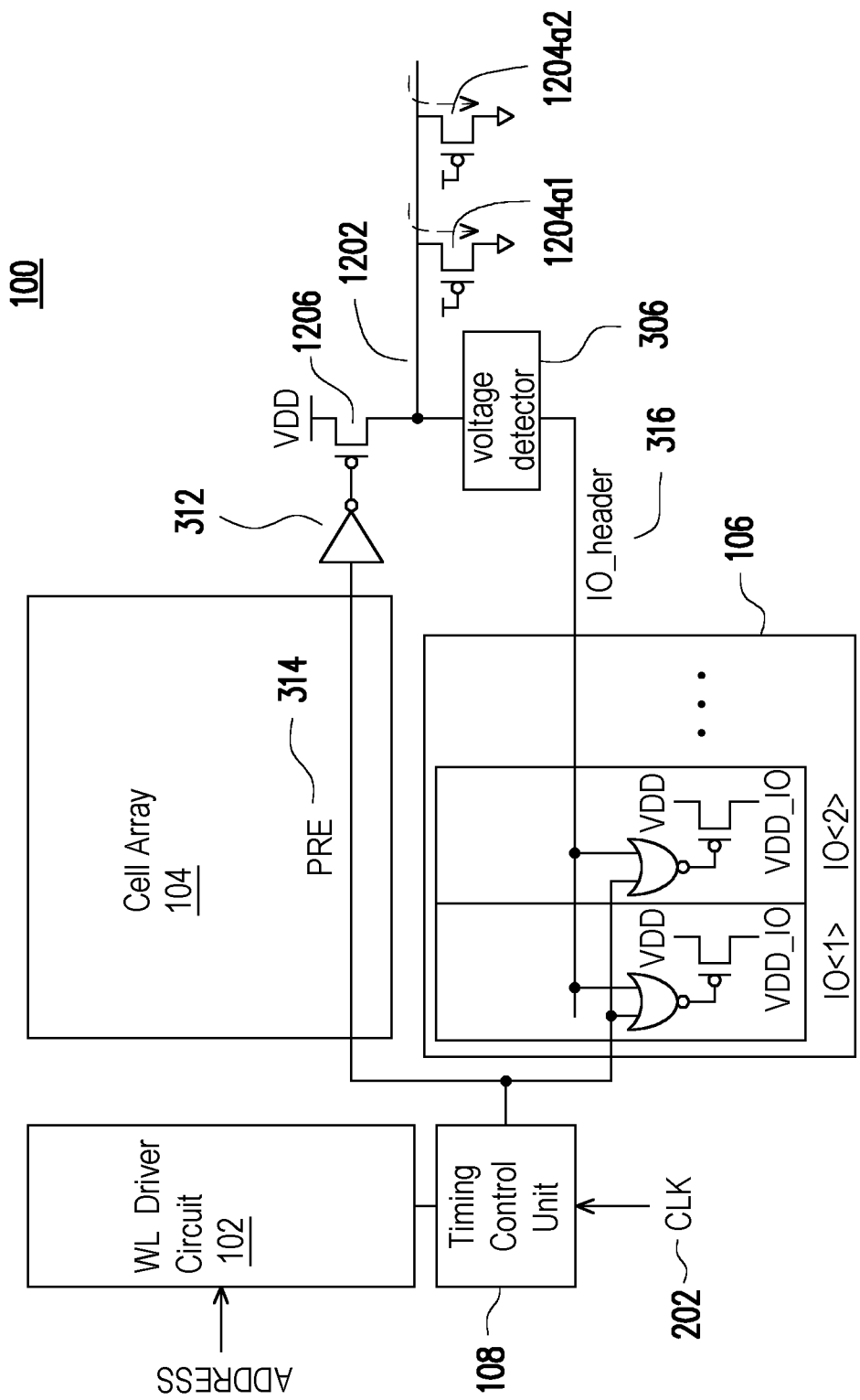
FIG. 12 is a diagram illustrating a memory device with yet another example header power control mechanism in a nap mode, in accordance with some embodiments.

FIG. 12 is a diagram of memory device 100 with yet another example header power control mechanism in a nap mode, in accordance with some embodiments. As shown in FIG. 12, memory device 100 includes word line driver circuit 102, cell array 104, I/O circuit 106, and timing control unit 108. In addition, and as shown in FIG. 12, memory device 100 includes a replica VDD_IO 1202 and voltage detector 306. Moreover, it will be apparent to a person with ordinary skill in the art after reading this disclosure that memory device 100 can include more components or fewer components than those shown in FIG. 12.

A first output terminal of timing control unit 108 is connected to an input terminal of NOT logic circuit 312. An output terminal of NOT logic circuit 304 is connected to a gate of a VDD IO transistor 1206. Source of VDD IO transistor 1206 is connected to a supply voltage (that is, VDD) and a drain of VDD IO transistor 1206 is connected to replica VDD_IO 1202. A plurality of replica VDD transistors, for example, a first replica VDD transistor 1204a1, a second replica VDD transistor 1204a2, . . . , etc., are connected to replica VDD_IO 1202. A gate of each of the plurality of replica VDD transistors is connected to a supply voltage (that is, VDD). A source of each of the plurality of replica VDD transistors is connected to replica VDD_IO 1202. In addition, a drain of each of the plurality of replica VDD transistors is connected to ground. Voltage detector 306 is connected to replica VDD_IO 1202 and is operative to compare the voltage on replica VDD_IO 1202 with predetermined voltage level 420.

In example embodiments, VDD IO transistor 1206 and each of the plurality of replica VDD transistors (that is, first replica VDD transistor 1204a1, second replica VDD transistor 1204a2, . . . , etc.,) is a p-channel metal oxide semiconductor (pMOS) transistors. However, other types of transistors are within the scope of the disclosure. For example, VDD IO transistor 1206 and each of the plurality of replica VDD transistors can be a MOSFET, an nMOS transistor, or a CMOS transistor. In addition, VDD IO transistor 1206 and each of the plurality of replica VDD transistors are symmetrical. That is, a source of VDD IO transistor 1206 and each of the plurality of replica VDD transistors can be a drain, and a drain can be a source.

For a read or a write operation, timing control unit 108 generates a PRE signal 314 at first output terminal based on clock signal 202. PRE signal 314 rises to a logic high when clock signal 202 rises to a logic high. This causes the output terminal of NOT logic circuit 312 and hence the gate of VDD IO transistor 1206 to drop to a logic low. This switches on VDD IO transistor 1206 thereby connecting replica VDD_IO 1202 to a supply voltage (that is, VDD) which pre-charges replica VDD_IO 1202 to a predetermined potential or voltage.

After a predetermined time from rising to a logic high, PRE signal 314 drops to a logic low which causes the output terminal of NOT logic circuit 312 and hence the gate of VDD IO transistor 1206 to drop to a logic low. This switches off VDD IO transistor 1206 thereby disconnecting replica VDD_IO 1202 from a supply voltage (that is, VDD). After being disconnected from a supply voltage (that is, VDD), replica VDD_IO 1202 starts to discharge through the plurality of replica transistors (that is, first replica VDD transistor 1204a1, second replica VDD transistor 1204a2, . . . , etc.,). In example embodiments, a rate of discharge of replica VDD_IO 1202 is dependent on a number of the plurality of replica transistors connected to replica VDD_IO 1202.

Voltage detector 306 continuously compares a remaining voltage on replica VDD_IO 1202 with predetermined voltage level 420. When the remaining voltage on replica VDD_IO 1202 is above predetermined voltage level 420, an output terminal of voltage detector 306 (that is, IO_header signal 316) is at a logic high. This causes the headers of I/O circuit 106 to remain switched on until beginning of a next clock cycle. Hence, and in accordance with example embodiments, when a remaining voltage on replica VDD_IO 1202 is above predetermined voltage level 420, the headers of I/O circuit 106 remain switched on.

However, when the voltage on replica VDD_IO 1202 drops below predetermined voltage level 420, the output terminal of voltage detector 306 (that is, IO_header signal 316) drops to a logic low. This results in switching off the headers or portions of the headers of I/O circuit 106. Thus, and in accordance with example embodiments, the headers or portions of the headers of I/O circuit 106 are switched off from the power nap period T_nap until the beginning of a next clock cycle of clock signal 202.

Figure 13:
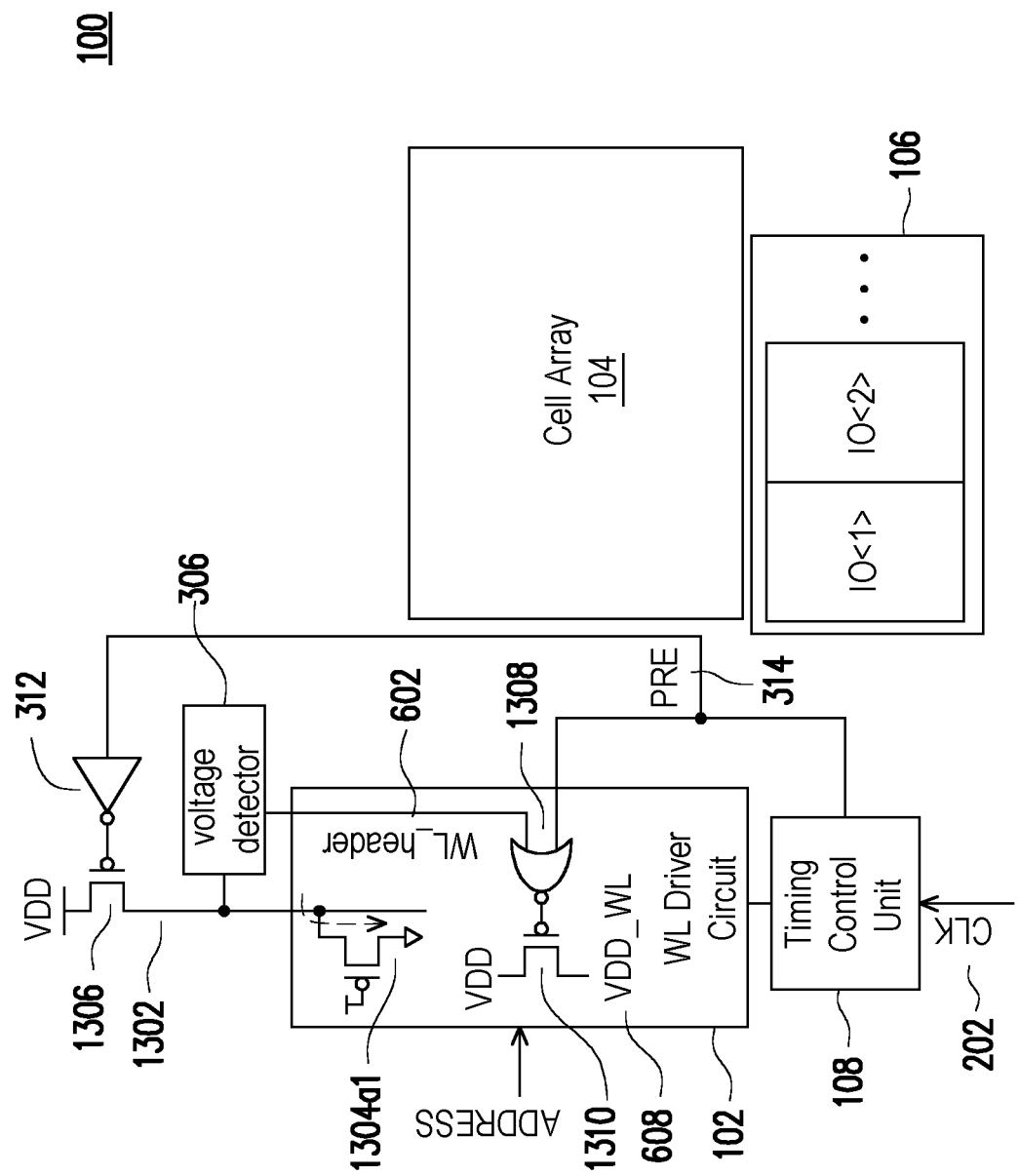
FIG. 13 is a diagram illustrating a memory device with yet another example header power control mechanism in a nap mode, in accordance with some embodiments.

FIG. 13 is a diagram of memory device 100 with yet another example header power control mechanism in a nap mode, in accordance with some embodiments. As shown in FIG. 13, memory device 100 includes word line driver circuit 102, cell array 104, I/O circuit 106, and timing control unit 108. In addition, and as shown in FIG. 13, memory device 100 includes a replica VDD_WL 1302 and voltage detector 306. Moreover, it will be apparent to a person with ordinary skill in the art after reading this disclosure that memory device 100 can include more components or fewer components than those shown in FIG. 13.

A first output terminal of timing control unit 108 is connected to an input terminal of NOT logic circuit 312. An output terminal of NOT logic circuit 312 is connected to a gate of a VDD WL transistor 1306. Source of VDD WL transistor 1306 is connected to a supply voltage (that is, VDD) and a drain of VDD WL transistor 1306 is connected to replica VDD_WL 1302. A plurality of replica VDD transistors, for example, a first replica VDD transistor 1304a1, . . . , etc., are connected to replica VDD_WL 1302. A gate of each of the plurality of replica VDD transistors is connected to a supply voltage (that is, VDD). A source of each of the plurality of replica VDD transistors is connected to VDD_WL 1302. In addition, a drain of each of the plurality of replica VDD transistors is connected to ground. Voltage detector 306 is connected to replica VDD_WL 1302 and is operative to compare the voltage on replica VDD_WL 1302 with predetermined voltage level 420.

In example embodiments, VDD WL transistor 1306 and each of the plurality of replica VDD transistors (that is, first replica VDD transistor 1304a1, . . . , etc.,) are a p-channel metal oxide semiconductor (pMOS) transistors. However, other types of transistors are within the scope of the disclosure. For example, VDD WL transistor 1306 and each of the plurality of replica VDD transistors can be a MOSFET, an nMOS transistor, or a CMOS transistor. In addition, VDD WL transistor 1306 and each of the plurality of replica VDD transistors are symmetrical. That is, a source can be a drain, and a drain can be a source.

For a read or a write operation, timing control unit 108 generates a PRE signal 314 at first output terminal based on clock signal 202. PRE signal 314 rises to a logic high when clock signal 202 rises to a logic high. This causes the output terminal of NOT logic circuit 312 and hence the gate of VDD WL transistor 1306 to drop to a logic low. This switches on VDD WL transistor 1306 thereby connecting replica VDD_WL 1302 to a supply voltage (that is, VDD) which charges replica VDD_IO 1202 to a predetermined potential or voltage.

After a predetermined time from rising to a logic high, PRE signal 314 drops to a logic low which causes the output terminal of NOT logic circuit 312 and hence the gate of VDD WL transistor 1306 to drop to a logic low. This switches off VDD WL transistor 1306 thereby disconnecting replica VDD_WL 1302 from a supply voltage (that is, VDD). After being disconnected from a supply voltage (that is, VDD), replica VDD_WL 1302 starts to discharge through the plurality of replica transistors (that is, first replica VDD transistor 1304a1, . . . , etc.,). In example embodiments, a discharge rate of replica VDD_WL 1302 is dependent on a number of the plurality of replica transistors connected to replica VDD_WL 1302.

Voltage detector 306 continuously compares a remaining voltage on replica VDD_WL 1302 with predetermined voltage level 420. When a remaining voltage on VDD_WL 1302 is above predetermined voltage level 420, an output terminal of voltage detector 306 (that is, WL_header signal 602) is at a logic high. By extension, the first input terminal of NOR logic circuit 1308 is at a logic high, and therefore, an output of NOR logic circuit 1308 (that is, the output terminal of NOR logic circuit 1308) is at a logic low. In addition, when the output terminal of NOR logic circuit 1308 is at a logic low, a gate power control transistor 1310 is at a logic low which switches on power control transistor 1310. Therefore, a header of word line driver circuit 102 remains switched on when remaining voltage on replica VDD_WL 1302 is above predetermined voltage level 420. In addition, a drain of power control transistor 1310 is connected to a supply voltage (that is, VDD) and is at a logic high. This causes, VDD_WL signal 608 (that is, a virtual power supply signal to word line driver circuit 102) to be at a logic high.

However, when the remaining voltage on VDD_IO 1302 drops below predetermined voltage level 420, the output terminal of voltage detector 306 (that is, WL_header signal 602) drops to a logic low. By extension, the first input terminal of NOR logic circuit 1308 is at a logic low and an output of NOR logic circuit 1308 (that is, the output terminal of NOR logic circuit 1308) is at a logic high. In addition, when the output terminal of NOR logic circuit 1308 is at a logic high, the gate of power control transistor 1310 is at a logic high which switches off power control transistor 1310. Hence, and in accordance with example embodiments, when a remaining voltage on replica VDD_WL 1302 drops below predetermined voltage level 420, the headers or portions of the headers of word line driver circuit 102 are switched off. In addition, the drain of power control transistor 1310 is disconnected from a supply voltage (that is, VDD) and is at a logic low. This causes, VDD_WL signal 608 to drop to a logic low, and by extension the virtual power supply signal to word line driver circuit 102 drop to a logic low when a remaining voltage on replica VDD_WL 1302 drops below predetermined voltage level 420.

Figure 14A:
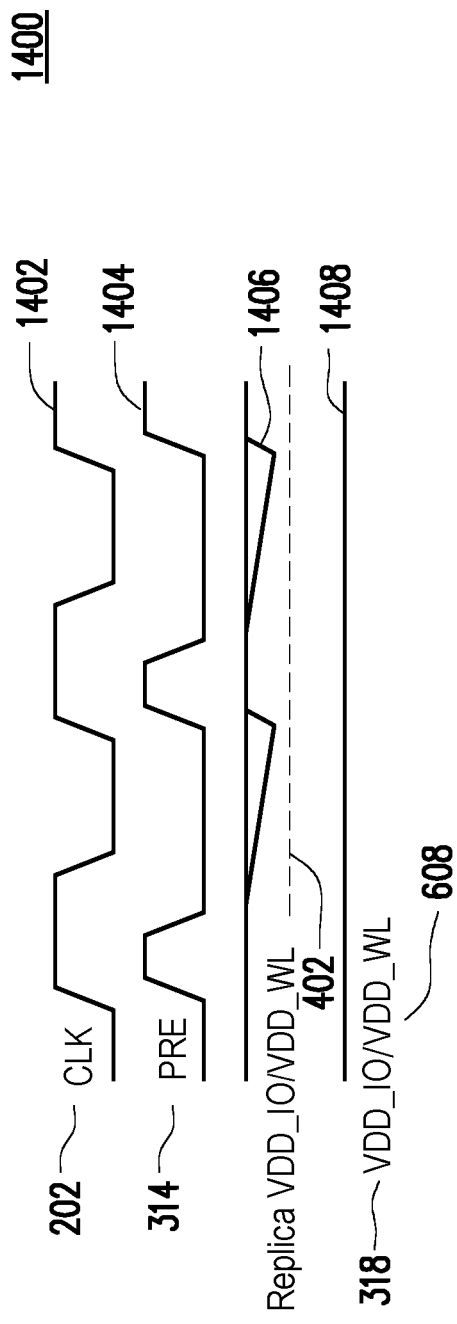
FIG. 14A is a graph illustrating a clock signal at a first frequency and other signals of a memory devices of FIGS. 12 and 13 corresponding to the clock signal at the first frequency, in accordance with some embodiments.

FIG. 14A is a graph 1400 illustrating clock signal 202 at a first frequency and other signals of memory device 100 of FIGS. 12 and 13 corresponding to clock signal 202 at the first frequency, in accordance with some embodiments. For example, a first plot 1402 of graph 1400 is a representative of clock signal 202. A second plot 1404 of graph 1400 is a representative of PRE signal 314. A third plot 1406 of graph 1400 is a representative of a remaining voltage on replica VDD_IO 1202 and replica NDD_WL 1302. A fourth plot 1408 of graph 1400 is a representative of both VDD_IO signal 318 and VDD_WL signal 608.

As shown first plot 1402 and second plot 1404 of graph 1400 of FIG. 14A, PRE signal 314 rises to a logic high when clock signal 202 rises to a logic high. In addition, and as shown in third plot 1406 of graph 1400, remaining voltages on both of replica VDD_IO 1202 and replica VDD_WL 1302 starts to drop when PRE signal 314 drops to a logic low. PRE signal 314 changes to a logic low after a predetermined time from rising to a logic high.

Continuing with FIG. 14A, and as shown third plot 1406, a remaining voltage on either of replica VDD_IO 1202 or replica VDD_WL 1302 does not drop below predetermined voltage level 420 for a first clock cycle at the first frequency of clock signal 202. And when clock signal 202 rises to a logic high for a next clock cycle, the remaining voltages on each of replica VDD_IO 1202 and replica VDD_WL 1302 rise above predetermined voltage level 420. Hence, and as shown in fourth plot 1408, both VDD_IO signal 318 and VDD_WL signal 608, remain at a logic high. As a result, the headers of IO circuit 106 and word line driver circuit 102 remain switched on when the cycle period of clock signal 202 is less than the power nap period T_nap.

Figure 14B:
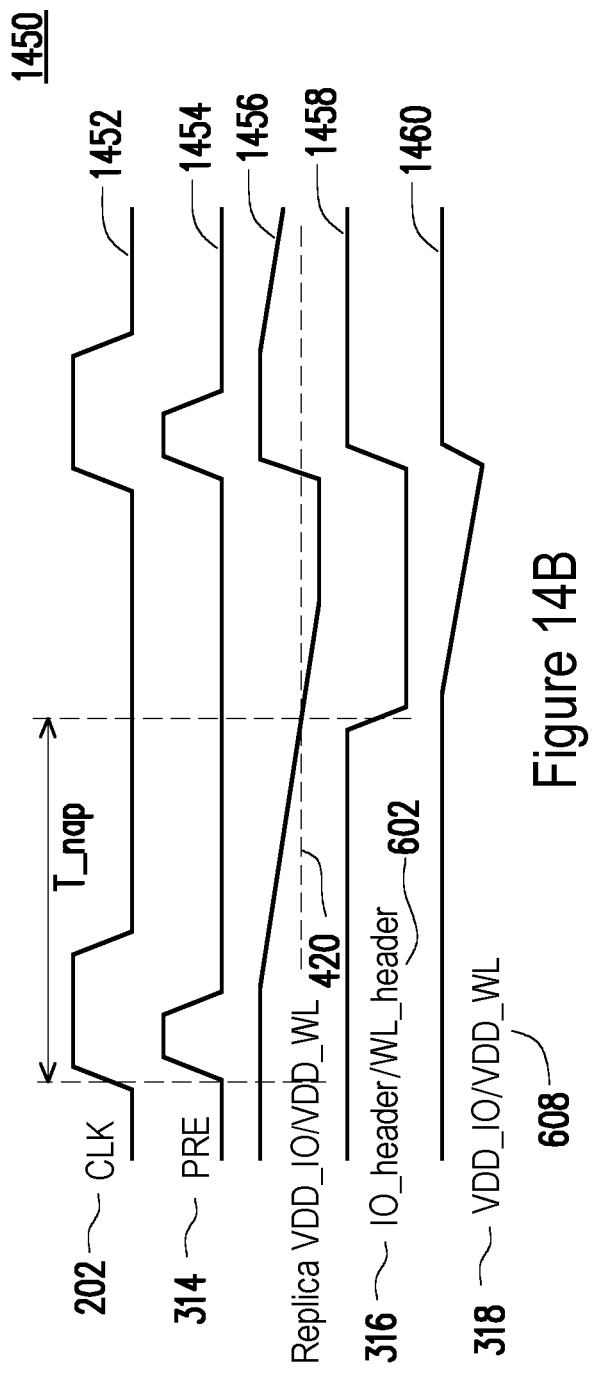
FIG. 14B is a graph illustrating a clock signal at a second frequency and other signals of a memory devices of FIGS. 12 and 13 corresponding to the clock signal at the second frequency, in accordance with some embodiments.

FIG. 14B is a graph 1450 illustrating clock signal 202 at a second frequency and other signals of memory device 100 of FIGS. 12 and 13 corresponding to clock signal 202 at the second frequency, in accordance with some embodiments. For example, a first plot 1452 of graph 1450 is a representative of clock signal 202 at a second frequency and a second plot 1454 of graph 1450 is a representative of PRE signal 314. A third plot 1456 of graph 1450 is a representative of a remaining voltage on both replica VDD_IO 1202 and replica VDD_WL 1302. A fourth plot 1458 of graph 1450 is a representative of both IO_header signal 316 and WL header signal 602. A fifth plot 1460 of graph 1450 is a representative of both VDD_IO signal 318 and VDD_WL signal 608.

As shown first plot 1452 of FIG. 14B, the second frequency of clock signal 202 is lower than the first frequency depicted in first plot 1402 of FIG. 14A. Therefore, a clock cycle period T2 for clock signal 202 corresponding to the second frequency is greater than the clock cycle period T1 of clock cycle 202 corresponding the first frequency. The longer clock cycle period provides, and as shown in a third plot 1456 of graph 1450, sufficient time (that is, the power nap period T_nap) for remaining voltages on replica VDD_IO 1202 and replica VDD_WL 1302 to drop below predetermined voltage level 420. This, and as shown in fourth plot 1458 of graph 1450, results in both IO_header signal 316 and WL_header signal 602 changing from a logic high to a logic low at the end of the power nap period T_nap.

Changing of IO_header signal 316 to a logic low results in switching off of the headers or portions of the headers of I/O circuit 106. In response, and as shown in fifth plot 1460 of graph 1450, VDD_IO signal 318 (that is, the virtual power supply signal to I/O circuit 106) changes from a logic high to a logic low at the end of the power nap period T_nap. Similarly, changing of WL_header signal 602 to a logic low results in switching off of the headers or portions of the headers of word line driver circuit 102. In response, and as shown in fifth plot 1460 of graph 1450, VDD_WL signal 608 (that is, the virtual power supply signal to word line driver circuit 102) changes from a logic high to a logic low at the end of the power nap period T_nap.

Continuing with FIG. 14B, and as shown in second plot 1454 of graph 1450, at the end of the first clock cycle period, PRE signal 314 rises from a logic low to a logic high in response to starting of a next clock cycle. This, and as shown third plot 1456 of graph 1450, results in pre-charging of replica VDD_IO 1202 and replica VDD_WL 1302. With the pre-charging of replica VDD_IO 1202 and replica VDD_WL 1302, a remaining voltage on both replica VDD_IO 1202 and replica VDD_WL 1302 rises above predetermined voltage level 420. Hence, and as shown in fourth plot 1458 and fifth plot 1460 of graph 1450, both IO_header signal 316 and VDD_IO signal 318 change from a logic low to a logic high at the beginning of a next clock cycle. IO_header signal 316 rising to a logic high results in switching back on the headers of I/O circuit 106. Similarly, WL_header signal 602 rising to a logic high results in switching on of the headers of word line driver circuit 102. As a result, the headers or portions of the headers of I/O circuit 106 are switched off from an end of the power control period T_nap to an end of a cycle period for clock signal 202 at the second frequency.

Similarly, the headers or portions of the headers of word line driver circuit 102 are switched off from an end of the power control period T_nap to an end of a cycle period for clock signal 202 at the second frequency. Therefore, and in accordance with example embodiments, the headers or portions of the headers of I/O circuit 106 and the headers of or portions of the headers of word line driver circuit 102 are switched off from an end of the power control period T_nap to an end of a cycle period for a current cycle for clock signal 202 at a lower frequency.

In addition, and as shown in fourth plot 1458 and fifth plot 1460 of graph 1450, both WL_header signal 602 and VDD_WL signal 608 change from a logic low to a logic high at the beginning of a next clock cycle. VDD_IO signal 318 rising to a logic high results in the virtual power supply signal to I/O circuit 106 rising to a logic high. Similarly, VDD_WL signal 608 rising to a logic high results in the virtual power supply signal to word line driver circuit 102 rising to a logic high.

Figure 15:
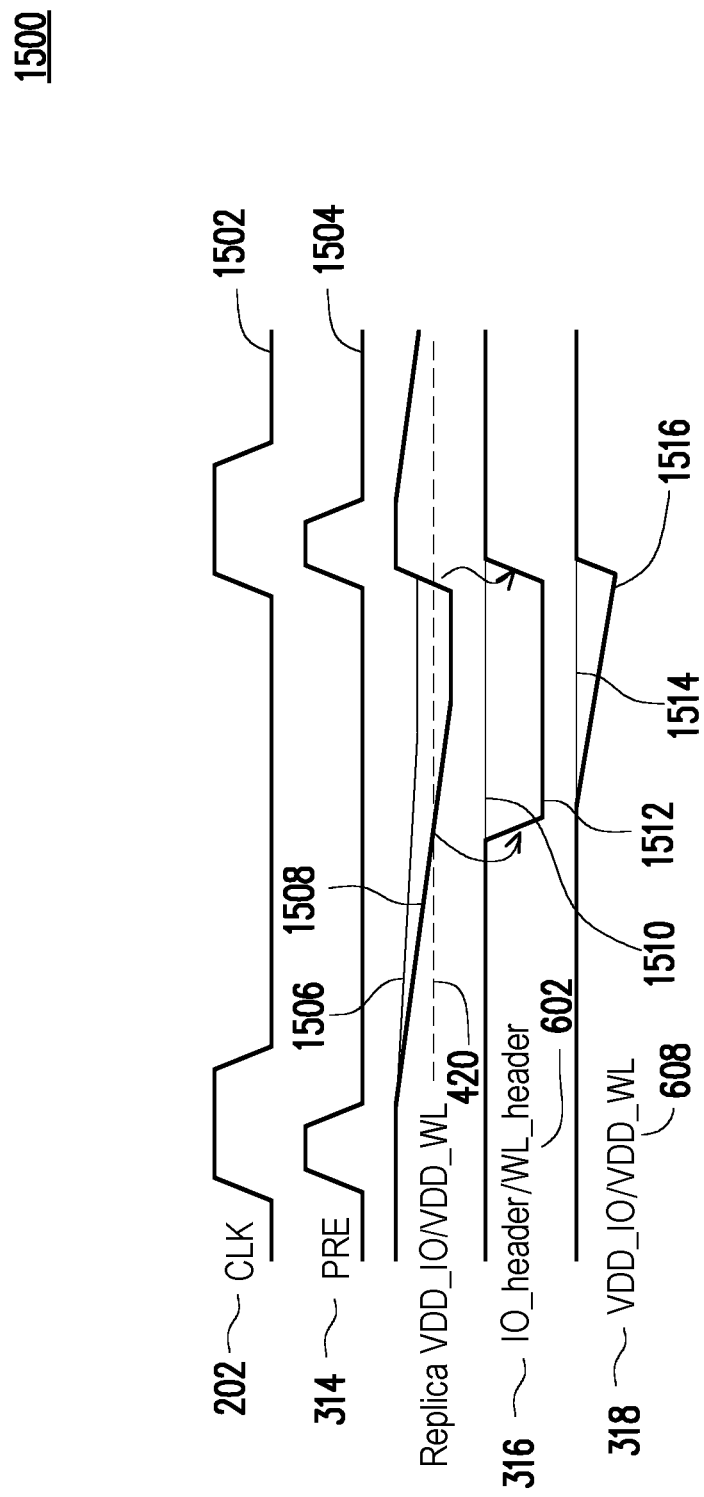
FIG. 15 is a graph illustrating a clock signal and other signals of memory device of FIGS. 12 and 13 corresponding to a different number of replica VDD transistors, in accordance with some embodiments.

FIG. 15 is a graph 1500 illustrating clock signal 202 and other signals for memory device 100 of FIGS. 12 and 13 for a different number of the plurality of replica VDD transistors connected to replica VDD_IO 1202 and replica VDD_WL 1302, in accordance with some embodiments. For example, a first plot 1502 of graph 1500 is a representative of clock signal 202 and a second plot 1504 of graph 1500 is a representative of PRE signal 314. A third plot 1506 of graph 1500 is a representative of a remaining voltage on both replica VDD_IO 1202 and replica VDD_WL 1302 with a first plurality of replica VDD transistors. A fourth plot 1508 of graph 1500 is a representative of a remaining voltage on both replica VDD_IO 1202 and replica VDD_WL 1302 with a second plurality of replica VDD transistors. A fifth plot 1510 of graph 1500 is a representative of both IO_header signal 316 and WL header signal 602 corresponding to replica VDD_IO 1202 and replica VDD_WL 1302 with the first plurality replica VDD transistors.

In addition, a sixth plot 1512 of graph 1500 is a representative of both IO_header signal 316 and WL header signal 602 corresponding to replica VDD_IO 1202 and replica VDD_WL 1302 with the second plurality of replica VDD transistors. A seventh plot 1514 of graph 1500 is a representative of both VDD_IO signal 318 and VDD_WL signal 608 corresponding to replica VDD_IO 1202 and replica VDD_WL 1302 with the first plurality replica VDD transistors. An eighth plot 1516 of graph 1500 is a representative of both VDD_IO signal 318 and VDD_WL signal 608 corresponding to replica VDD_IO 1202 and replica VDD_WL 1302 with the second plurality of replica VDD transistors. The second plurality of replica VDD transistors includes more number of replica VDD transistors than the first plurality of replica VDD transistors.

As shown first plot 1502 and second plot 1504 of graph 1500 of FIG. 15, PRE signal 314 rises to a logic high when clock signal 202 rises to a logic high. In addition, and as shown in third plot 1506 and fourth plot 1508, the remaining voltages on replica VDD_IO 1202 and replica VDD_WL 1302 starts to drop when PRE signal 314 drops to a logic low from a logic high. However, and as shown third plot 1506 and fourth plot 1508, a remaining voltage on each of replica VDD_IO 1202 and replica VDD_WL 1302 with the first plurality of replica VDD transistors drop at slower rate than a remaining voltage at each of replica VDD_IO 1202 and replica VDD_WL 1302 with the second plurality of replica VDD transistors. PRE signal 314 changes to a logic low after a predetermined time from rising to a logic high or after pre-charging of replica VDD_IO 1202 and replica VDD_WL 1302 respectively.

A slower discharge rate, and as shown in a third plot 1506 of graph 1500, does not provide a sufficient time (that is, the power nap period T_nap) for a remaining voltage on replica VDD_IO 1202 with the first plurality of replica VDD transistors to drop below predetermined voltage level 420 before beginning of a next clock cycle. Similarly, a slower discharge rate, and as shown in a third plot 1506 of graph 1500, does not provide a sufficient time (that is, the power nap period T_nap) for a remaining voltage on replica VDD_WL 1302 with the first plurality of replica VDD transistors to drop below predetermined voltage level 420 before beginning of a next clock cycle. And when clock signal 202 rises to a logic high for a next clock cycle, a remaining voltage on each of replica VDD_IO 1202 and replica VDD_WL 1302 with the first plurality of replica VDD transistors starts to rise again.

As a result, and as shown in fifth plot 1510, both IO_header signal 316 and WL_header signal 602 remain at a logic high. Hence, the headers of I/O circuit 106 and word line driver circuit 102 remain switched on when the cycle period of clock signal 202 is less than the power nap period T_nap. That is, the headers I/O circuit 106 and the headers of word line driver circuit 102 are not switched off before the starting of a next clock cycle when the cycle period of clock signal 202 is less than the power nap period T_nap. And by extension, both VDD_IO signal 318 (that is, the virtual power supply signal to I/O circuit 106) and WL signal 608 (that is, the virtual power supply signal to word line driver circuit 102) remain at a logic high.

On the contrary, a faster discharge rate, and as shown in a fourth plot 1508 of graph 1500, provides a sufficient time (that is, the power nap period T_nap) for a remaining voltage on each of replica VDD_IO 1202 and replica VDD_WL 1302 with the second plurality of replica VDD transistors to drop below predetermined voltage level 420 before beginning of a next clock cycle. Hence, and as shown in sixth plot 1510, both IO_header signal 316 and WL_header signal 602 drop from a logic high to a logic low. Changing of IO_header signal 316 to a logic low results in switching off the headers or portions of the headers of I/O circuit 106 at the end of the power nap period T_nap. Similarly, changing of WL_header signal 602 to a logic low results in switching off of the headers or portions of the headers of word line driver circuit 102 at the end of the power nap period T_nap. In addition, and as shown in eighth plot 1506 of graph 1500, both VDD_IO signal 318 (that is, the virtual power supply signal to I/O circuit 106) and VDD_WL signal 608 (that is, the virtual power supply signal to word line driver circuit 102) change from a logic high to a logic low at the end of the power nap period T_nap.

Continuing with FIG. 15B, and as shown in second plot 1504 of graph 1500, at the end of the first clock cycle period, PRE signal 314 rises from a logic low to a logic high in response to the beginning of a next clock cycle. Rising of PRE signal 314 to a logic high, as shown fourth plot 1508 of graph 1500, results in pre-charging of replica VDD_IO 1202 and replica VDD_WL 1302 with the second plurality of replica VDD transistors. With the pre-charging of replica VDD_IO 1202 and replica VDD_WL 1302 with the second plurality of replica VDD transistors, a remaining voltage on each of replica VDD_IO 1202 and replica VDD_WL 1302 with the second plurality of replica VDD transistors rise above predetermined voltage level 420.

As a result and as shown in sixth plot 1512 of graph 1500, both IO_header signal 316 and WL_header signal 602 change from a logic low to a logic high at the beginning of a next clock cycle. IO_header signal 316 changing to a logic high results in switching back on of the headers of I/O circuit 106. Similarly, WL_header signal 602 changing to a logic high results in switching back on of the headers of word line driver circuit 102. Hence, and in accordance with example embodiments, the headers or portions of the headers of I/O circuit 106 and word line driver circuit 102 are switched off from an end of the power control period T_nap to an end of a cycle period for clock signal 202 for replica VDD_IO 1202 and replica VDD_WL 1302 with the second plurality of replica VDD transistors. In addition, and as shown in eighth plot 1516 of graph 1500, both VDD_IO signal 318 (that is, the virtual power supply signal to I/O circuit 106) and VDD_WL signal 608 (that is, the virtual power supply signal to word line driver circuit 102) change from a logic low to a logic high at the beginning of a next clock cycle.

Hence, for a same frequency of clock signal 202, a more number of replica VDD transistors connected to replica VDD_IO 1202 and replica VDD_WL 1302 increases a discharge rate of replica VDD_IO 1202 and replica VDD_WL 1302 thereby reducing the power control period T_nap. Therefore, in accordance with example embodiment, the power control period T_nap can be controlled by controlling a number of the plurality of replica VDD transistors connected to replica VDD_IO 1202 and replica VDD_WL 1302.

Figure 16:
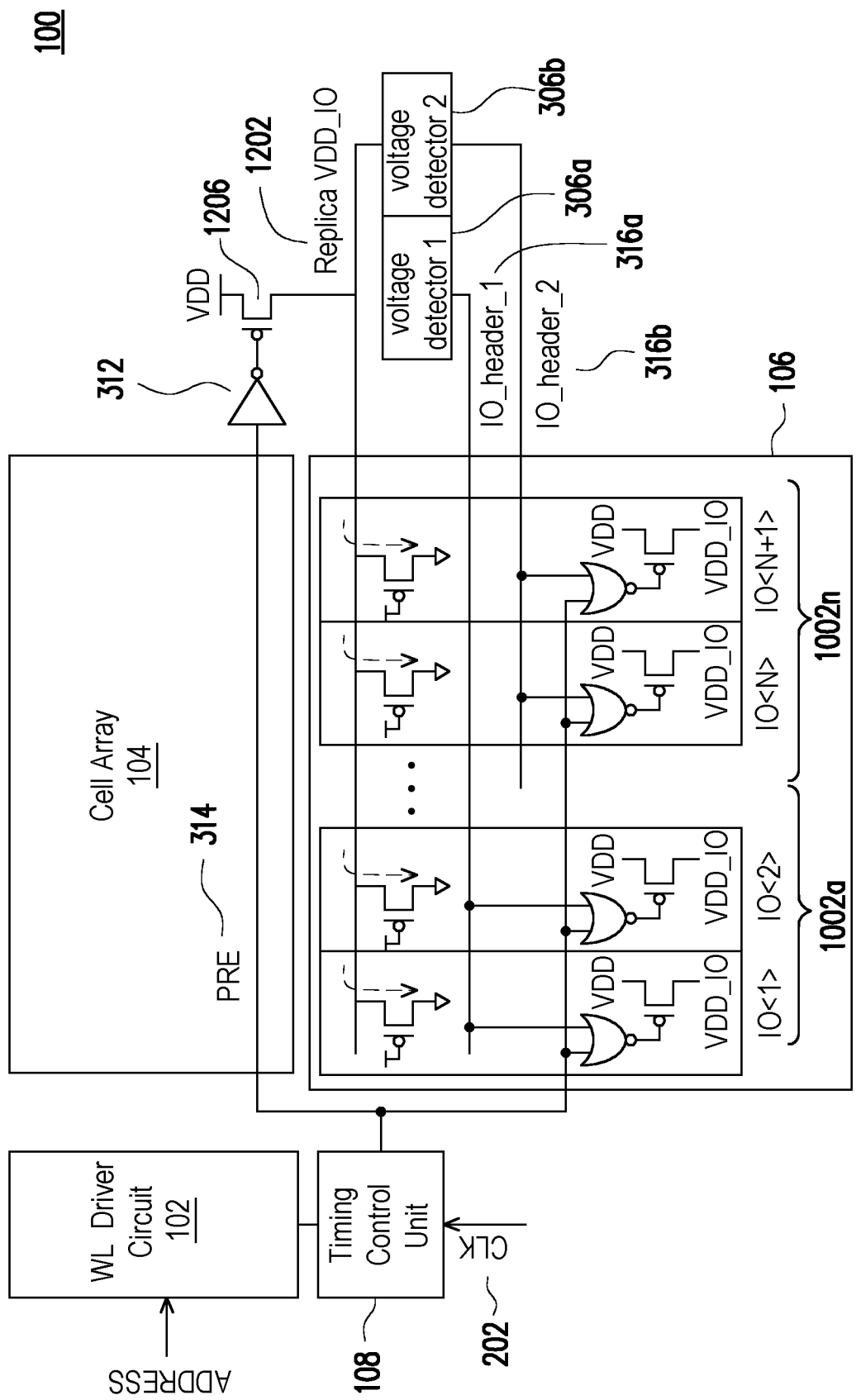
FIG. 16 is a diagram illustrating a memory device with yet another example header power control mechanism in a nap mode, in accordance with some embodiments.

FIG. 16 is a diagram of memory device 100 with yet another example header power control mechanism in a nap mode, in accordance with some embodiments. As shown in FIG. 16, memory device 100 includes word line driver circuit 102, cell array 104, I/O circuit 106, and timing control unit 108. In addition, and as shown in FIG. 16, memory device 100 includes a replica VDD_IO 1202, first voltage detector 306*a*, and second voltage detector 306*b*. Moreover, it will be apparent to a person with ordinary skill in the art after reading this disclosure that memory device 100 can include more components or fewer components than those shown in FIG. 16.

I/O circuit 106 is shown to include first group of components 1002a and nth group of components 1002n. Headers for first group of components 1002a are controlled by IO_header_1 signal 316a and headers for nth group of components 1002n are controlled by IO_header_2 signal 316b. In addition, IO_header_1 signal 316a is generated by first voltage detector 306a and IO_header_2 signal 316b is generated by second voltage detector 306b. It will be apparent to a person with ordinary skill in the art after reading this disclosure that I/O circuit 106 includes more than two groups of components and more than two voltage detector circuits 306.

A first output terminal of timing control unit 108 is connected to an input terminal of NOT logic circuit 312. An output terminal of NOT logic circuit 312 is connected to the gate of VDD transistor 1206. The source of VDD transistor 1206 is connected to the supply voltage and the drain of VDD transistor 1206 is connected to replica VDD_IO 1202. Each of first voltage detector 306a and second voltage detector 306b is connected to replica VDD_IO 1202.

Each of first voltage detector 306a and second voltage detector 306b is associated with a different predetermined voltage levels. For example, first voltage detector 306a is associated with first predetermined voltage level 420a. First voltage detector 306a is operative to generating IO_header_1 signal 316a in response to comparing a remaining voltage on replica VDD_IO 1202 with first predetermined voltage level 420a. Similarly, second voltage detector 306b is associated with second predetermined voltage level 420b. Second voltage detector 306b is operative to generating IO_header_2 signal 316b in in response to comparing a remaining voltage on replica VDD_IO 1202 with second predetermined voltage level 420b. First predetermined voltage level 420a is different from second predetermined voltage level 420b. For example, first predetermined voltage level 420a is lower than or more than second predetermined voltage level 420b.

In example embodiments, when a remaining voltage of replica VDD_IO 1202 drops below first predetermined voltage level 420a, the output terminal of first voltage detector 306a drops to logic low which results in IO_header_1 signal 316a dropping to a logic low. IO_header_1 signal 316a dropping to a logic low causes switching off of the headers of portions of the headers associated with first group of components 1002a of I/O circuit 106. Similarly, when the remaining voltage of replica VDD_IO 1202 drops below second predetermined voltage level 420b, the output terminal of second voltage detector 306b drops to logic low which results in IO_header_2 signal 316b dropping to a logic low. IO_header_2 signal 316b dropping to a logic low causes switching off of the headers or portions of the headers associated with second group of components 1002b of I/O circuit 106.

Figure 17:
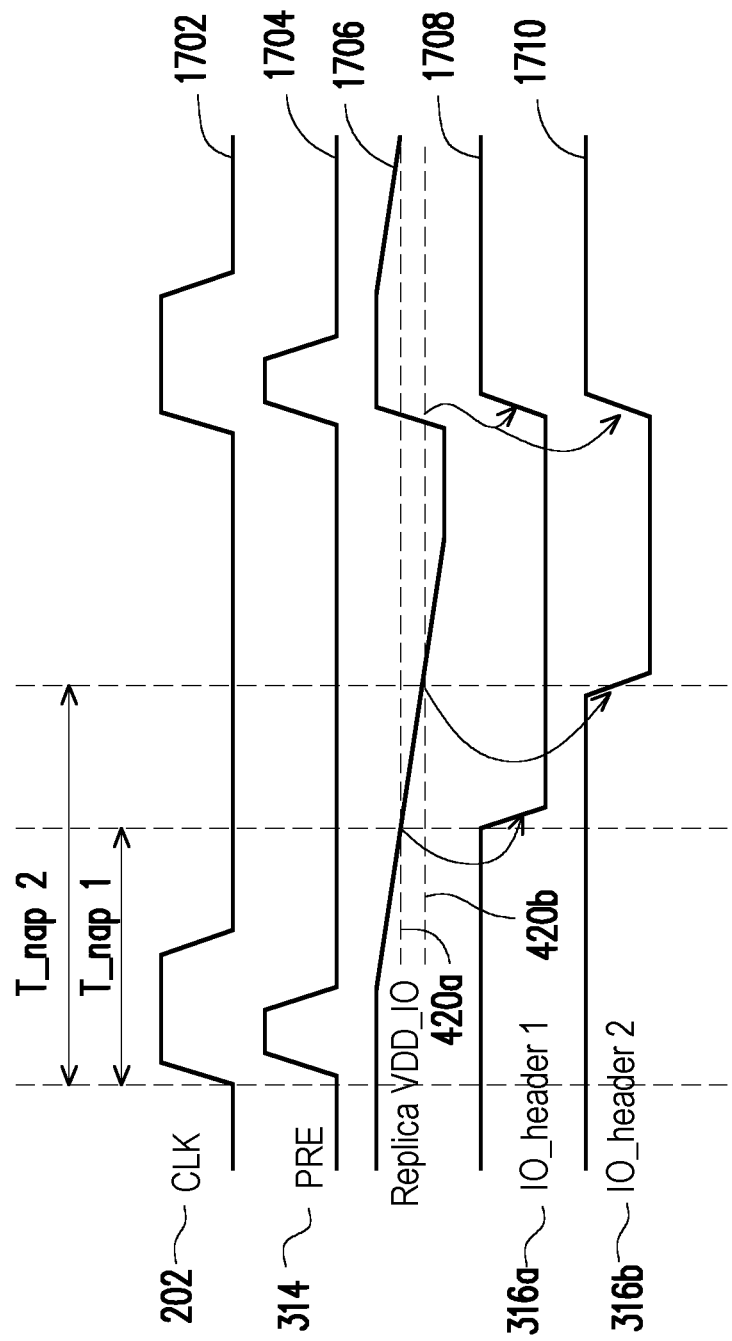
FIG. 17 is a graph illustrating a clock signal and other signals of memory device of FIG. 16 corresponding to the clock signal, in accordance with some embodiments.

FIG. 17 is a graph 1700 illustrating clock signal 202 and other signals of memory device 100 of FIG. 16 corresponding to clock signal 202 in accordance with some embodiments. For example, a first plot 1702 of graph 1700 is a representative of clock signal 202 and a second plot 1704 of graph 1700 is a representative of PRE signal 314. A third plot 1706 of graph 1700 is a representative of a remaining voltage on replica VDD_IO 1202. A fourth plot 1708 of graph 1700 is a representative of IO_header_1 signal 316a. A fifth plot 1710 of graph 1700 is a representative of IO_header_2 signal 316b.

As shown first plot 1702 and second plot 1704 of graph 1700, PRE signal 314 rises to a logic high when clock signal 202 rises to a logic high. In addition, and as shown in third plot 1706 of graph 1700, a remaining voltage on replica VDD_IO 1202 starts to drop when PRE signal 314 drops to a logic low from a logic high. PRE signal 314 changes to a logic low after a predetermined time from rising to a logic low or after a pre-charging of replica VDD_IO 1202.

Continuing with FIG. 17, as shown in fourth plot 1708 of graph 1700, IO_header_1 signal 316a changes from a logic high to a logic low when a remaining voltage on replica VDD_IO 1202 drops below first predetermined voltage level 420a at the end of a first power nap period T_nap 1 which corresponds to first voltage detector 306a. This results in switching off of the headers or portions of the headers of first group of component 1102a of I/O circuit 106. In addition, and as shown in fifth plot 1710 of graph 1700, IO_header_2 signal 316b changes from a logic high to a logic low when a remaining voltage on replica VDD_IO 1202 drops below second predetermined voltage level 420b at the end of a second power nap period T_nap 2 which corresponds to second voltage detector 306b. This results in switching off of the headers or portions of the headers of second group of component 1102b of I/O circuit 106. Therefore, and in accordance with example embodiments, different group of components of IO circuit 106 (and also word line driver circuit 102) can be switched off at different times in a clock cycle.

Figure 18:
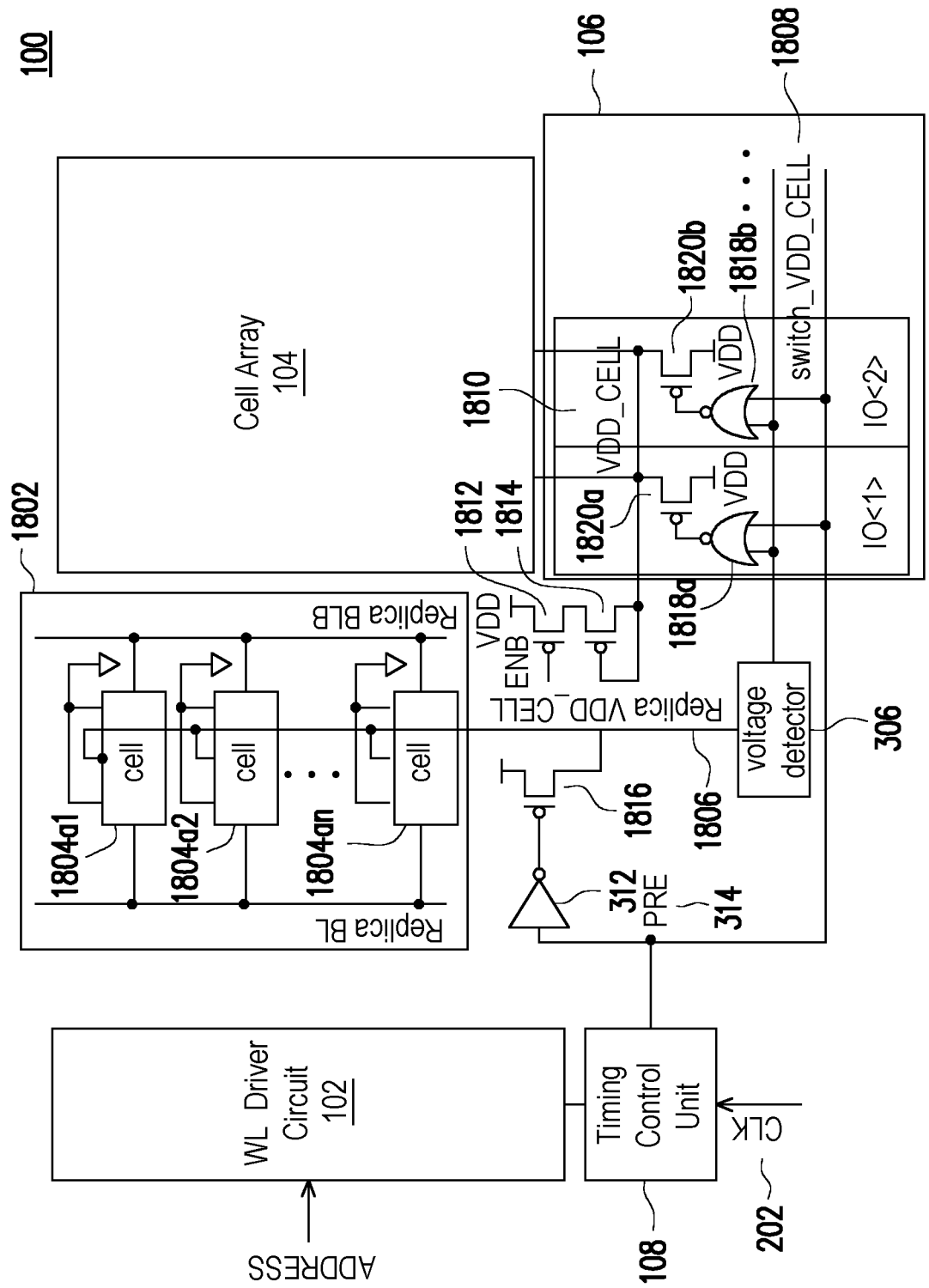
FIG. 18 is a diagram illustrating a memory device with yet another example header power control mechanism in a nap mode, in accordance with some embodiments.

FIG. 18 is a diagram of memory device 100 with yet another example header power control mechanism in a nap mode in accordance with some embodiments. As shown in FIG. 18, memory device 100 includes word line driver circuit 102, cell array 104, I/O circuit 106, and timing control unit 108. In addition, and as shown in FIG. 18, memory device 100 includes a replica cell column 1802 and voltage detector 306. Moreover, it will be apparent to a person with ordinary skill in the art after reading this disclosure that memory device 100 can include more components or fewer components than those shown in FIG. 18.

Replica cell column 1802 includes a plurality of replica cells, for example, a first replica cell 1804a1, a second replica cell 1804a2, . . . , a nth replica cell 1804an. Each of the plurality of replica cells are connected to a replica VDD_cell 1806. A first output terminal of timing control unit 108 is connected to an input terminal of NOT logic circuit 312. An output terminal of NOT logic circuit 312 is connected to a gate of a first cell transistor 1816. Source of first cell transistor 1816 is connected to a supply voltage (that is, VDD) and a drain of first cell transistor 1816 is connected to replica VDD_cell 1806. Voltage detector 306 is connected to replica VDD_cell 1806 and is operative to compare a remaining voltage on replica VDD_cell 1806 with predetermined voltage level 420.

An output terminal of voltage detector 306 is connected to a first input terminal of each of a first NOR logic circuit 1818a and a second NOR logic 1818b. It will be apparent to a person with ordinary skill in the art after reading this disclosure that the output terminal of voltage detector 306 can be connected to other NOR logic circuits of memory 100. A second input terminal of each of first NOR logic circuit 1818a and a second NOR logic 1818b is connected to the first output terminal of timing control unit 108. It will be apparent to a person with ordinary skill in the art after reading this disclosure that the first output terminal of timing control unit 108 can be connected to other NOR logic circuits of memory 100.

An output terminal of first NOR logic circuit 1818a is connected to a gate of first power transistor 1820a and an output terminal of second NOR logic circuit 1818b is connected to a gate of a second power transistor 1820b. A drain of each of first power transistor 1820a and second power transistor 1820b is connected to a supply voltage (that is, VDD). A source of each of first power transistor 1820a and second power transistor 1820b is connected to a VDD_cell 1810. VDD_cell 1810 is operative to supply the virtual power supply signal to cell array 104.

A source of a first flip transistor 1812 is connected to the supply voltage (that is, VDD) and a drain of first flip transistor 1812 is connected to a source of a second flip transistor 1814. A gate of first flip transistor 1812 is connected to a write enable signal. A gate of second flip transistor 1814 is connected to a drain of second flip transistor 1814 which is connected to VDD_cell 1810.

In example embodiments, each of first transistor 1816, first flip transistor 1812, second flip transistor 1814, first power transistor 1820a, and second power transistor 1820b is a p-channel metal oxide semiconductor (pMOS) transistors. However, other types of transistors are within the scope of the disclosure. For example, each of first transistor 1816, first flip transistor 1812, second flip transistor 1814, first power transistor 1820a, and second power transistor 1820b can be a MOSFET, an nMOS transistor, or a MOS transistor. In addition, each of first transistor 1816, first flip transistor 1812, second flip transistor 1814, first power transistor 1820a, and second power transistor 1820b is symmetrical. That is, a source of each of first transistor 1816, first flip transistor 1812, second flip transistor 1814, first power transistor 1820a, and second power transistor 1820b can be a drain, and a drain can be a source.

For a read or a write operation, timing control unit 108 generates a PRE signal 314 at first output terminal based on clock signal 202. PRE signal 314 rises to a logic high when clock signal 202 rises to a logic high. PRE signal rising to a logic high causes the output terminal of NOT logic circuit 304 and hence the gate of first transistor 1816 to drop to a logic low. This switches on first transistor 1816 thereby connecting replica VDD_cell 1810 to the supply voltage (that is, VDD) thereby pre-charging VDD_cell 1810 to a predetermined voltage.

After a predetermined time from rising to a logic high, PRE signal 314 drops to a logic low which causes the output terminal of NOT logic circuit 304 and hence the gate of first transistor 1816 to rise to a logic high. This switches off first transistor 1816 thereby disconnecting replica VDD_cell 1816 from the supply voltage (that is, VDD). After being disconnected from the supply voltage (that is, VDD), replica VDD_cell 1806 starts to discharge through the plurality of replica cells (that is, first replica cell 1804a1, second replica cell 1804a2, . . . , nth replica cell 1804an). In example embodiments, a rate of discharge of replica VDD_cell 1806 is dependent on a number of the plurality of transistors connected to replica VDD_cell 1806.

Voltage detector 306 continuously compares a remaining voltage on replica VDD_cell 1806 with predetermined voltage level 420. When a remaining voltage on replica VDD_cell 1806 is above predetermined voltage level 420, an output terminal of voltage detector 306 (that is, switch_VDD_cell signal 1808) is at a logic high. This causes the output terminals of each of first NOR logic circuit 1818a and second NOR logic circuit 1818b to drop to a logic low which in turn causes the gates of first power transistor 1820a and second power transistor 1820b to switch on. Switching on of first power transistor 1820a and second power transistor 1820b causes VDD_cell 1810 to be connected to the supply voltage (that is, the VDD) and corresponding headers of cell array 104 to remain switched on.

However, when a remaining voltage on replica VDD_cell 1806 drops below predetermined voltage level 420, the output terminal of voltage detector 306 (that is, switch VDD_cell signal 1808) drops to a logic low. This causes the output terminals of each of first NOR logic circuit 1818a and second NOR logic circuit 1818b to rise to a logic high which in turn causes the gates of first power transistor 1820a and second power transistor 1820b to switch off. Switching off of first power transistor 1820a and second power transistor 1820b causes VDD_cell 1810 to be disconnected to the supply voltage (that is, the VDD) and corresponding headers of cell array 104 to switch off. Thus, and in accordance with example embodiments, the headers or a portion of the headers of cell array 104 are switched off when a remaining voltage on replica VDD_cell 1806 drops below predetermined voltage level 420.

FIG. 19A is a graph 1900 illustrating clock signal 202 at a first frequency and other signals of memory device 100 of FIG. 18 corresponding to clock signal 202 at the first frequency, in accordance with some embodiments. For example, a first plot 1902 of graph 1900 is a representative of clock signal 202 and a second plot 1904 of graph 1900 is a representative of PRE signal 314. A third plot 1906 of graph 1900 is a representative of a voltage on the replica VDD_cell 1806, and a fourth plot 1908 of graph 1900 is a representative of a voltage on VDD_cell 1810.

As shown first plot 1902 and second plot 1904 of graph 1900 of FIG. 19A, PRE signal 314 rises to a logic high when clock signal 202 rises to a logic high. In addition, and as shown in third plot 1906 of graph 1900, a remaining voltage on replica VDD_cell 1806 starts to drop when PRE signal 314 drops to a logic low from a logic high. However, and as shown third plot 1906, a remaining voltage on replica VDD_cell 1806 does not drop below predetermined voltage level 420 before beginning of a next clock cycle. And when clock signal 202 rises to a logic high for a next clock cycle, a remaining voltage on replica VDD_cell 1806 starts to rise. Hence, and as shown in fourth plot 1908, the voltage on VDD_cell 1810 remains at a logic high. As a result, the headers of cell array 104 remain switched on when the cycle period of clock signal 202 is less than the power nap period T_nap.

FIG. 19B is a graph 1950 illustrating clock signal 202 at a second frequency and other signals of memory device 100 corresponding to clock signal 202 at the second frequency, in accordance with some embodiments. For example, a first plot 1952 of graph 1950 is a representative of clock signal 202 at a second frequency and a second plot 1954 of graph 1950 is a representative of PRE signal 314. A third plot 1956 of graph 1950 is a representative of a voltage on replica VDD_cell 1806. A fourth plot 1958 of graph 1950 is a representative of both switch_VDD_cell signal 1808. A fifth plot 1960 of graph 1950 is representative of a voltage of VDD_cell 1810.

As shown first plot 1952 of FIG. 19B, the second frequency of clock signal 202 is lower than the first frequency associated with first plot 1902 of FIG. 19A. Therefore, a clock cycle period T2 for clock signal 202 corresponding to the second frequency is greater than the clock cycle period T1 of clock cycle 202 at the first frequency. The longer clock cycle period provides, and as shown in a third plot 1956 of graph 1950, sufficient time (that is, the power nap period T_nap) for the voltage on replica VDD_cell 1806 to drop below predetermined voltage level 420. This, and as shown in fourth plot 1958 of graph 1950, results in switch_VDD_cell signal 1808 changing from a logic high to a logic low at the end of the power nap period T_nap. In response, and as shown in fifth plot 1960 of graph 1950, the voltage of VDD_cell 1810 changes from a logic high to a logic low at the end of the power nap period T_nap. Changing of the voltage on VDD_cell 1810 to a logic low results in switching off headers of or portions of cell array 104.

Continuing with FIG. 19B, and as shown in second plot 1954 of graph 1950, at the end of the first clock cycle period, PRE signal 314 rises from a logic low to a logic high in response to starting of a next clock cycle. Changing of PRE signal 314 to a logic high, and as shown third plot 1956 of graph 1950, results in charging of replica VDD_cell 1806. With the charging of replica VDD_cell 1806, a remaining voltage on replica VDD_cell 1806 rises above predetermined voltage level 420. Hence, and as shown in fourth plot 1958 of graph 1950, switch_VDD_cell signal 1808 changes from a logic low to a logic high. In addition, and as shown in fifth plot 1960 of graph 1950 the voltage on VDD_cell 1810 changes from a logic low to a logic high. The voltage on VDD_cell 1810 rising to a logic high results in switching on of the headers of cell array 104. Hence, the headers of cell array 104 are switched off from an end of the power control period T_nap to an end of a cycle period for clock signal 202.

Figure 20:
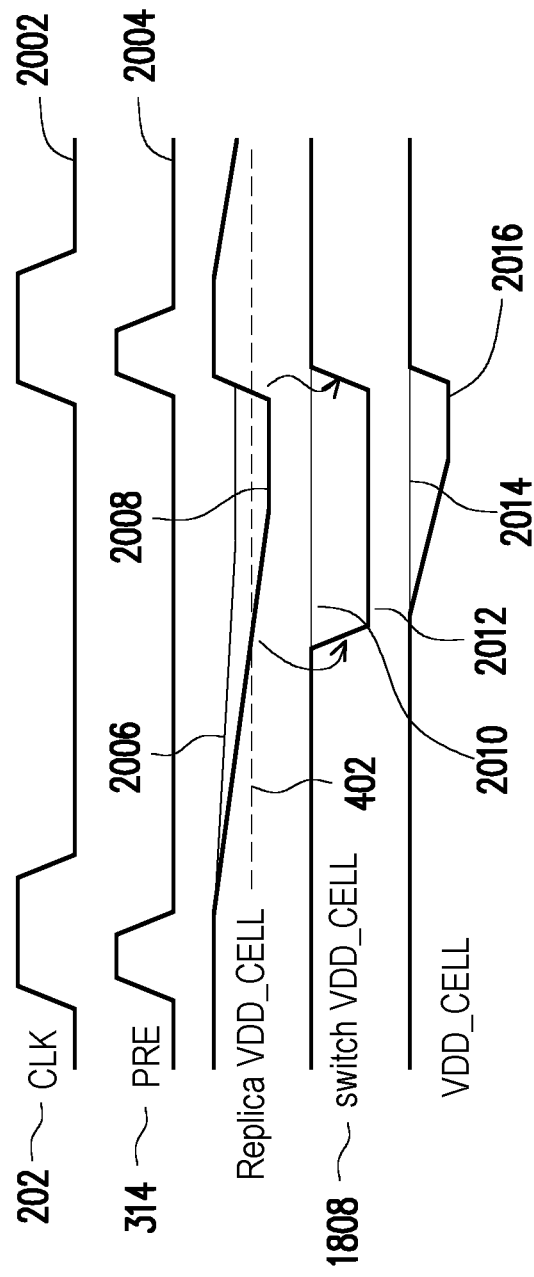
FIG. 20 is a graph illustrating a clock signal and other signals of memory device of FIG. 18 corresponding to a different number of replica cells, in accordance with some embodiments.

FIG. 20 is a graph 2000 illustrating clock signal 202 for a different number of the plurality of replica cells connected to replica VDD_cell 1806, in accordance with some embodiments. For example, a first plot 2002 of graph 2000 is a representative of clock signal 202 and a second plot 2004 of graph 2000 is a representative of PRE signal 314. A third plot 2006 of graph 2000 is a representative of a voltage on replica VDD_cell 1806 with a first plurality of replica cells. A fourth plot 2008 of graph 2000 is a representative of a voltage on replica VDD_cell 1806 with a second plurality of replica cells. A fifth plot 2010 of graph 2000 is a representative of switch_VDD_cell signal 1808 with the first plurality replica cells. A sixth plot 2012 of graph 2000 is a representative of switch_VDD_cell signal 1808 with the second plurality replica cells. A seventh plot 2014 of graph 2000 is representative of the voltage on VDD_cell 1810 with the first plurality of replica cells. An eighth plot 2016 of graph 2000 is representative the voltage on VDD_cell 1810 with the second plurality replica cells. The second plurality of replica cells includes greater number of replica cells than the first plurality of replica cells.

As shown first plot 2002 and second plot 2004 of graph 2000 of FIG. 20, PRE signal 314 rises to a logic high when clock signal 202 rises to a logic high. In addition, and as shown in third plot 2006 and fourth plot 2008, a remaining voltage on replica VDD_cell 1806 starts to drop when PRE signal 314 drops to a logic low. However, and as shown third plot 2006 and fourth plot 2008, a remaining voltage on replica VDD_cell 1806 with the first plurality of replica cells drop at slower rate than replica VDD_cell 1806 with the second plurality of replica cells.

The a slower discharge rate, and as shown in a third plot 2006 of graph 2000, does not provide a sufficient time (that is, the power nap period T_nap) for a remaining voltage on replica VDD_cell 1806 with the first plurality of replica cells to drop below predetermined voltage level 420 before beginning of a next clock cycle. And when clock signal 202 rises to a logic high for a next clock cycle, a remaining voltage on replica VDD_cell 1806 with the first plurality of VDD transistors continues to stay above predetermined voltage level 420. Hence, and as shown in fifth plot 2010, switch_VDD_cell signal 1808 remains at a logic high. And by extension, the voltage on VDD_cell 1810 remains at a logic high. As a result, none of the headers of or portions of the headers of cell array 104 are switched off before the starting of a next clock cycle. That is, the headers of cell array 104 remain switched on when the cycle period of clock signal 202 is less than the power nap period T_nap.

On the contrary a faster discharge rate, and as shown in a fourth plot 2008 of graph 2000, provides a sufficient time (that is, the power nap period T_nap) for a remaining voltage on replica VDD_cell 1806 with the second plurality of replica cells to drop below predetermined voltage level 420 before the beginning of a next clock cycle. Hence, and as shown in sixth plot 2010, switch_VDD_cell signal 1808 drops from a logic high to a logic low. And by extension, the voltage on VDD_cell 1810 drops to a logic low at the end of the power nap period T_nap. Changing of the voltage on VDD_cell 1810 to a logic low results in switching off headers of or portions of headers of cell array 104.

Continuing with FIG. 20, and as shown in second plot 2004 of graph 2000, at the end of the first clock cycle period, PRE signal 314 rises from a logic low to a logic high in response to starting of a next clock cycle. Rising of PRE signal 314 to a logic high, and as shown fourth plot 2008 of graph 2000, results in pre-charging of replica VDD_cell 1806 with the second plurality of replica cells. With the pre-charging of replica VDD_cell 1806 with the second plurality of replica cells, a remaining voltage on replica VDD_cell 1806 with the second plurality of replica cells rises above predetermined voltage level 420. Hence, and as shown in sixth plot 2012 and eighth plot 2016 of graph 2000, switch_VDD_cell signal 1808 and the voltage on VDD_cell 1810 change from a logic low to a logic high. The voltage on VDD_cell 1810 rising to a logic high results in switching on of the headers of or the portion of headers cell array 104. Hence, the headers of cell array 104 are switched off from an end of the power control period T_nap to an end of a cycle period for clock signal 202.

In example embodiments, for a same frequency of clock signal 202, a greater number of replica cells connected to replica VDD_cell 1806 increases a discharge rate of replica VDD_cell 1806 thereby reducing the power control period T_nap. Therefore, in accordance with example embodiment, the power control period T_nap can be controlled by controlling a number of the plurality of replica cells connected to replica VDD_cell 1806 of replica column of cells 1802.

Figure 21:
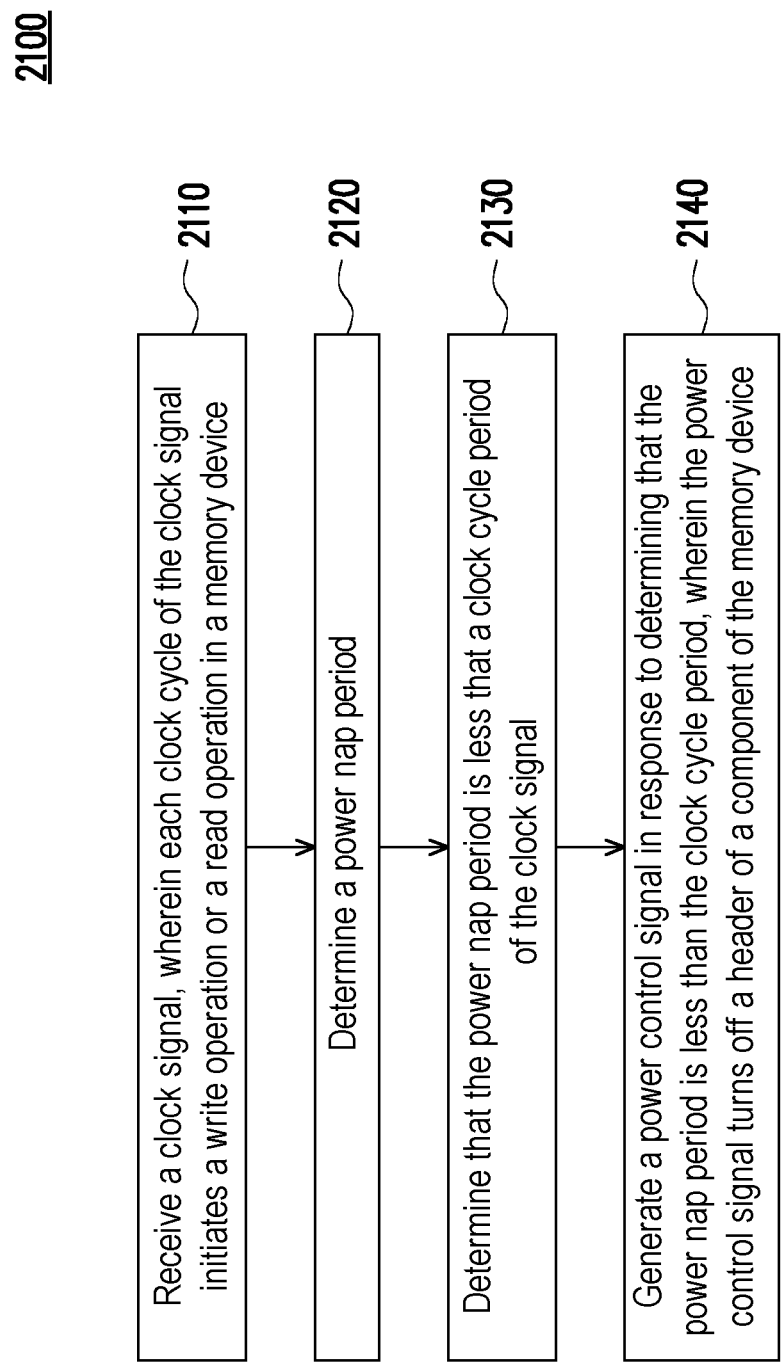
FIG. 21 is a flow diagram illustrating a method for operating a memory device in accordance with some embodiments.

FIG. 21 is a flow diagram illustrating a method 2100 for operating a memory device, in accordance with some embodiments. For example, FIG. 21 is a flow diagram illustrating method 2100 for operating memory device 100 as described above with reference to FIGS. 1-20. Method 2100 may be performed by a processor connected to a storage device. In addition, method 700 may be stored as instructions on a storage device, for example a non-transitory data storage device or a non-transitory computer readable medium, which when executed by a processor can cause the processor to perform method 2100.

At block 2110 of method 2100, a clock signal is received. Each clock cycle of the clock signal initiates a write operation or a read operation in a memory device. For example, clock signal 202 is received and each clock cycle of clock signal 202 initiates a read or a write operation in memory device 100.

At block 2120 of method 2100, a power nap period is determined. For example, the power nap period T_nap is determined by determining a logical OR of remaining voltages of a bit line BL and a complementary bit line BLB. In some examples, the power nap period T_nap is determined by comparing a remaining voltage on a replica bit line BL with predetermined voltage level 420. In other examples, the power nap period T_nap is determined by comparing a remaining voltage on a replica complementary bit line BLB with predetermined voltage level 420.

At block 2130 of method 2100, it is determined that the power nap period is less that a clock cycle period of the clock signal. At block 2140 of method 2100, a header control signal 204 is generated in response to determining that the power nap period is less than the clock cycle period. Header control signal 204 turns off a header of a component of the memory device. For example, IO_header signal 316 and WL_header signal 602 are generated in response to determining that the power nap period is less than the clock cycle period. IO_header signal 316 and WL_header signal 602 switch off the headers or portions of the headers of I/O circuit 106 and word line driver circuit 102 respectively.

In accordance with example embodiments, a method comprises: receiving a clock signal, wherein each clock cycle of the clock signal initiates a write operation or a read operation in a memory device; determining a power nap period; determining that the power nap period is less that a clock cycle period of the clock signal; and generating a header control signal in response to determining that the power nap period is less than the clock cycle period, wherein the header control signal turns off a header of a component of the memory device.

In example embodiments, an apparatus comprises: a storage device; and a processing unit connected to the storage device, the processing unit being operative to: determine a time period between pre-charging of a replica bit line and when a remaining charge on the replica bit line drops below a predetermined level; determine that the time period between pre-charging of the replica bit line and when the remaining charge on the replica bit line drops below the predetermined level is less than a clock cycle period of a clock signal, wherein each clock cycle of the clock signal initiates a write operation or a read operation in a cell array of a memory device; and switch off, in response to determining that the time period between pre-charging of the replica bit line and when the remaining charge on the replica bit line drops below the predetermined level is less than the clock cycle period, a header of a component of the memory device.

In accordance with example embodiments a memory device comprises: a cell array comprising a plurality of bit cells; a word line driver connected to the cell array, wherein the word line driver is operative to select, in response to a clock signal for a read operation or a write operation, a word line of the cell array and charge the selected word line to a predetermined voltage; an input/output circuit connected to the cell array, the input output circuit being operative to read data from and write data into the cell array; and a power control circuit connected to each of the cell array, the word line driver, and the input/output circuit, wherein the power control circuit is operative to selectively turn off a header of at least one of following: the cell array, the word line driver, and the input/output circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a clock signal, wherein each clock cycle of the clock signal initiates a write operation or a read operation in a memory device;
   determining a power nap period;
   determining that the power nap period is less that a clock cycle period of the clock signal; and
   generating a header control signal in response to determining that the power nap period is less than the clock cycle period, wherein the header control signal turns off a header of a component of the memory device.

2. The method of claim 1, wherein determining the power nap period comprises determining a time period between pre-charging of a bit line pair of the memory device and when a charge on the bit line pair drops below a predetermined level.

3. The method of claim 1, further comprising generating the header control signal in response to determining that the power nap period is less than the clock cycle period, wherein the header control signal switches off a header of an input/output circuit of the memory device.

4. The method of claim 1, wherein determining the power nap period comprises determining a time period between pre-charging of a replica bit line and when a charge on the replica bit line drops below a predetermined level.

5. The method of claim 4, further comprising generating the header control signal in response to determining that the power nap period is less than the clock cycle period, wherein the header control signal turns off an input/output circuit header of the memory device.

6. The method of claim 4, further comprising generating the header control signal in response to determining that the power nap period is less than the clock cycle period, wherein the header control signal turns off a word line driver circuit header of the memory device.

7. The method of claim 4, wherein the replica bit line is connected to at least one first type of memory cell and at least one second type of memory cell.

8. The method of claim 7, wherein the at least one first type of memory cell is forced to store a bit value of 0 at a Q node and a bit value of 1 at a Qbar node, and wherein the at least one second type of memory cell is forced to store the bit value of 1 at the Q node and the bit value of 1 at the Qbar node.

9. The method of claim 1, wherein determining the power nap period comprises:
   determining a first power nap period comprising a first time period between pre-charging of a replica bit line and when a charge on the replica bit line drops below a first predetermined level; and
   determining a second power nap period comprising a second time period between pre-charging of a replica bit line and when a charge on the replica bit line drops below a second predetermined level.

10. The method of claim 9, further comprising:
    generating a first header control signal in response to determining that the first power nap period is less than the clock cycle period, wherein the first header control signal turns off a first portion of an input/output circuit header of the memory device; and generating a header control signal in response to determining that the second power nap period is less than the clock cycle period, wherein the second header control signal turns off a second portion of the input/output circuit header.

11. An apparatus comprising:
a storage device; and
a processing unit connected to the storage device, wherein the processing unit is operative to:
  determine a time period between pre-charging of a replica bit line and when a remaining charge on the replica bit line drops below a predetermined level, wherein each clock cycle of the clock signal initiates a write operation or a read operation in a cell array of a memory device;
  determine that the time period between pre-charging of the replica bit line and when the remaining charge on the replica bit line drops below the predetermined level is less than a clock cycle period of a clock signal, wherein each clock cycle of the clock signal initiates a write operation or a read operation in a cell array of a memory device; and
  switch off, in response to determining that the time period between pre-charging of the replica bit line and when the remaining charge on the replica bit line drops below the predetermined level is less than the clock cycle period, a header of a component of the memory device.

12. The device of claim 11, wherein the processing unit being operative to determine that the time period between pre-charging of the replica bit line and when the remaining charge on the replica bit line drops below the predetermined level is less that the clock cycle period comprises the processing unit being operative to continuously compare the remaining charge on the replica bit line with the predetermined level.

13. The device of claim 11, wherein the processing unit is further operative to generate the header control signal when the determined time period between pre-charging of the replica bit line and when the remaining charge on the replica bit line drops below the predetermined level is less than the clock cycle period, wherein the header control signal turns off an input/output circuit header.

14. The device of claim 11, processing unit being operative to determine the power nap period comprises the processing unit being operative to:
  determine a first time period between pre-charging of the replica bit line and when the remaining charge on the replica bit line drops below a first predetermined level; and
  determine a second time period between pre-charging of the replica bit line and when the remaining charge on the replica bit line drops below a second predetermined level.

15. The device of claim 14, wherein the processing unit is further operative to:
  generate a first header control signal in response to determining that the first time period is less than the clock cycle period, wherein the first power header signal turns off a first portion of an input/output circuit header associated with the cell array; and
  generating a second header control signal in response to determining that the second time period is less than the clock cycle period, wherein the second header control signal turns off a second portion of the input/output circuit header.

16. The device of claim 11, wherein the replica supply voltage terminal is connected to a plurality of transistors, wherein the plurality of transistors are operative discharge a pre-charge voltage from the replica supply voltage terminal.

17. A memory device comprising:
a cell array comprising a plurality of bit cells;
a word line driver connected to the cell array, wherein the word line driver is operative to select, in response to a clock signal for a read operation or a write operation, a word line of the cell array and charge the selected word line to a predetermined voltage;
an input/output circuit connected to the cell array, the input output circuit being operative to read data from and write data into the cell array; and
a power control circuit connected to each of the cell array, the word line driver, and the input/output circuit, wherein the power control circuit is operative to selectively turn off a header of at least one of following: the cell array, the word line driver, and the input/output circuit.

18. The memory device of claim 17, wherein the power control circuit is operative to selectively turn off the header of at least one of following: the cell array, the word line driver, and the input/output circuit comprises the power control circuit being operative to:
  determine a power nap period;
  determine that the power nap period is less that a clock cycle period of a clock signal;
  generate a header control signal in response to determining that the power nap period is less than the clock cycle period, wherein the header control signal turns off the header of at least one of following: the cell array, the word line driver, and the input/output circuit.

19. The memory device of claim 18, wherein the power control circuit being operative to determine the power nap period comprises the power control circuit being operative to determine a time period between pre-charging of a replica supply voltage terminal for the word line driver and when a charge on the replica supply voltage terminal drops below a predetermined level.

20. The memory device of claim 18, wherein the power control circuit being operative to determine the power nap period comprises the power control circuit being operative to determine a time period between pre-charging of a replica supply voltage terminal for the cell array and when a charge on the replica supply voltage terminal drops below a predetermined level.

* * * * *

UNITED STATES PATENT AND TRADEMARK OFFICE
CERTIFICATE OF CORRECTION

| | |
|---|---|
| PATENT NO. | : 11,417,370 B2 |
| APPLICATION NO. | : 16/991178 |
| DATED | : August 16, 2022 |
| INVENTOR(S) | : Chien-Chen Lin |

It is certified that error appears in the above-identified patent and that said Letters Patent is hereby corrected as shown below:

On the Title Page

Item (57) Abstract, Line 6: "less that" should read --less than--

In the Drawings

Figure 21, reference numeral 2130: "less that" should read --less than--

In the Specification

Column 14, Line 2: "signal 202" should read --signal 202.--

Column 16, Line 5: "and WL header" should read --and WL_header--

Column 17, Line 11: "and WL header" should read --and WL_header--

Column 17, Line 14: "and WL header" should read --and WL_header--

Column 20, Line 33: "VDD IO transistor 1206. Source of VDD IO" should read --VDD_IO transistor 1206. Source of VDD_IO--

Column 20, Line 35: "VDD IO transistor" should read --VDD_IO transistor--

Column 20, Line 48: "VDD IO transistor" should read --VDD_IO transistor--

Column 20, Line 54: "VDD IO transistor" should read --VDD_IO transistor--

Column 20, Line 56: "In addition, VDD IO" should read --In addition, VDD_IO--

Column 20, Line 58: "source of VDD IO" should read --source of VDD_IO--

Signed and Sealed this
Twenty-seventh Day of August, 2024

Katherine Kelly Vidal
*Director of the United States Patent and Trademark Office*

CERTIFICATE OF CORRECTION (continued)
U.S. Pat. No. 11,417,370 B2

Column 20, Line 66: "VDD IO transistor" should read --VDD_IO transistor--

Column 20, Line 67: "VDD IO transistor" should read --VDD_IO transistor--

Column 21, Line 7: "VDD IO transistor" should read --VDD_IO transistor--

Column 21, Line 8: "VDD IO transistor" should read --VDD_IO transistor--

Column 21, Line 52: "VDD WL transistor 1306. Source of VDD WL" should read --VDD_WL transistor 1306. Source of VDD_WL--

Column 21, Line 54: "VDD IO transistor" should read --VDD_IO transistor--

Column 21, Line 66: "VDD WL transistor" should read --VDD_WL transistor--

Column 22, Line 4: "VDD WL transistor" should read --VDD_WL transistor--

Column 22, Lines 6-7: "In addition, VDD WL transistor 1306" should read --In addition, VDD_WL transistor 1306--

Column 22, Line 15: "VDD WL transistor" should read --VDD_WL transistor--

Column 22, Line 16: "VDD WL transistor" should read --VDD_WL transistor--

Column 22, Line 23: "VDD WL transistor" should read --VDD_WL transistor--

Column 22, Line 24: "VDD WL transistor" should read --VDD_WL transistor--

Column 23, Lines 48-49: "and WL header" should read --and WL_header--

Column 24, Line 67: "and WL header" should read --and WL_header--

Column 25, Line 4: "and WL header" should read --and WL_header--

Column 27, Line 34: "in in response to" should read --in response to--

Column 30, Line 6: "switch VDD_cell signal" should read --switch_VDD_cell signal--

Column 31, Line 58: "The a slower discharge" should read --The slower discharge--

Column 33, Line 8: "less that" should read --less than--

Column 33, Line 23: "less that" should read --less than--

Column 33, Line 53: "the input output circuit" should read --the input/output circuit--

CERTIFICATE OF CORRECTION (continued)
U.S. Pat. No. 11,417,370 B2

In the Claims

Column 34, Line 13, Claim 1: "less that" should read --less than--

Column 35, Line 33, Claim 12: "less that" should read --less than--

Column 36, Line 22, Claim 17: "input output circuit" should read --input/output circuit--

Column 36, Line 36, Claim 18: "less that" should read --less than--